(12) United States Patent
Becker et al.

(10) Patent No.: US 10,982,997 B2
(45) Date of Patent: Apr. 20, 2021

(54) RADIATION SENSOR WITH ANTI-GLARE PROTECTION

(71) Applicant: Commissariat à l'Énergie Atomique et aux Énergies Alternatives, Paris (FR)

(72) Inventors: Sébastien Becker, Voiron (FR); Abdelkader Aliane, Grenoble (FR); Denis Pelenc, Quaix en Chartreuse (FR); Jean-Jacques Yon, Sassenage (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 56 days.

(21) Appl. No.: 16/492,575

(22) PCT Filed: Mar. 14, 2018

(86) PCT No.: PCT/FR2018/050619
§ 371 (c)(1),
(2) Date: Sep. 9, 2019

(87) PCT Pub. No.: WO2018/167434
PCT Pub. Date: Sep. 20, 2018

(65) Prior Publication Data
US 2020/0240836 A1 Jul. 30, 2020

(30) Foreign Application Priority Data
Mar. 15, 2017 (FR) ...................................... 1752109

(51) Int. Cl.
*G01J 1/04* (2006.01)
*G01J 5/08* (2006.01)
(Continued)

(52) U.S. Cl.
CPC .................. *G01J 1/04* (2013.01); *G01J 5/045* (2013.01); *G01J 5/08* (2013.01); *G01J 5/20* (2013.01); *H01L 27/14669* (2013.01)

(58) Field of Classification Search
CPC ...... G01J 5/20; G01J 5/08; G01J 5/045; G01J 1/04; H01L 27/14669
See application file for complete search history.

(56) References Cited

U.S. PATENT DOCUMENTS 6,121,618 A 9/2000 Morris
10,520,364 B2 * 12/2019 Masini .................. B81B 3/0081
(Continued)

FOREIGN PATENT DOCUMENTS

EP 1 243 903 A2 9/2002

OTHER PUBLICATIONS

International Search Report and Written Opinion for International Application No. PCT/FR2018/050619, dated Aug. 16, 2018.
(Continued)

*Primary Examiner* — David P Porta
*Assistant Examiner* — Fani Boosalis
(74) *Attorney, Agent, or Firm* — Wolf, Greenfield & Sacks, P.C.

(57) ABSTRACT

A radiation sensor including a plurality of pixels formed in and on a semiconductor substrate, each pixel including a microboard suspended above the substrate by thermal insulation arms, the microboard including: a conversion element for converting incident electromagnetic radiation into thermal energy; and a passive optical shutter including a heat-sensitive layer covering one of the faces of the conversion element, the heat-sensitive layer having a reflection coefficient for the radiation to be detected that increases as a function of its temperature.

18 Claims, 9 Drawing Sheets

(51) Int. Cl.
*G01J 5/04* (2006.01)
*G01J 5/20* (2006.01)
*H01L 27/146* (2006.01)

(56) References Cited

U.S. PATENT DOCUMENTS

| | | | | |
|---|---|---|---|---|
| 2011/0266443 | A1* | 11/2011 | Schimert | G01J 1/0411 |
| | | | | 250/338.4 |
| 2011/0266444 | A1* | 11/2011 | Hanson | G01J 5/02 |
| | | | | 250/338.4 |
| 2011/0266445 | A1 | 11/2011 | Beratan | |
| 2016/0097681 | A1* | 4/2016 | Buchan | G01J 5/045 |
| | | | | 250/338.4 |

OTHER PUBLICATIONS

PCT/FR2018/050619, Sep. 26, 2019, International Preliminary Report on Patentability.

* cited by examiner

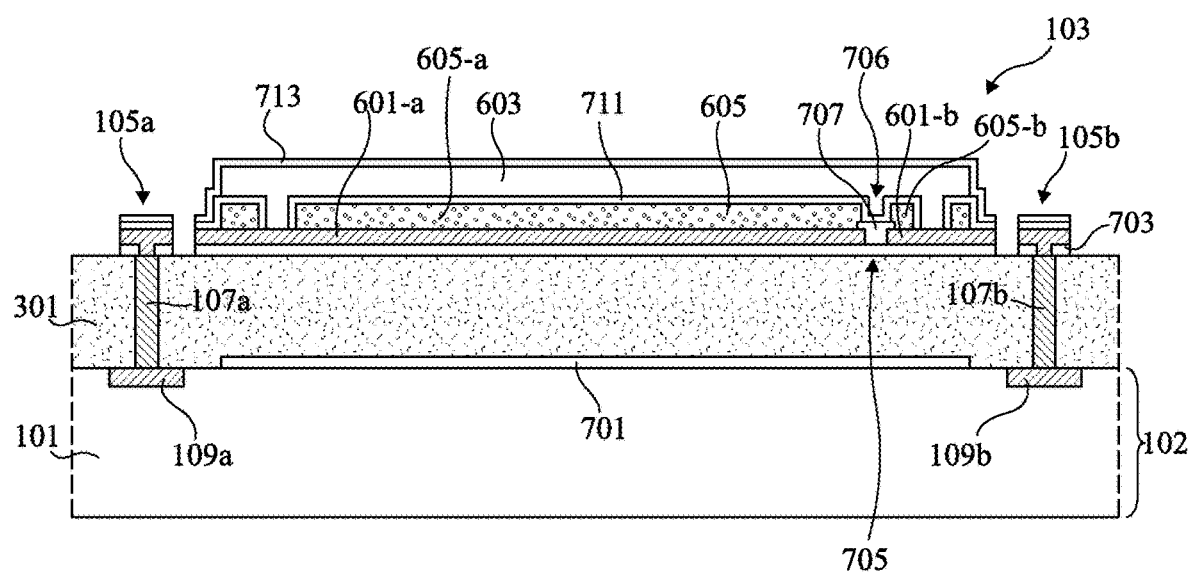
Fig 7bis

RADIATION SENSOR WITH ANTI-GLARE PROTECTION

CROSS-REFERENCE TO RELATED APPLICATIONS

This application is a national stage filing under 35 U.S.C. § 371 of International Patent Application Serial No. PCT/FR2018/050619, filed Mar. 14, 2018, which claims priority of French application number FR17/52109, filed Mar. 15, 2017. The entire contents of these applications are incorporated herein by reference in its entirety.

FIELD

The present disclosure relates to the field of radiation sensors, and is directed more specifically to sensors of the type comprising a plurality of elementary micro-detectors, or pixels, arranged in and on a semiconductor substrate, each pixel comprising a conversion element for converting electromagnetic radiation into an electrical signal, and a read circuit for reading the electrical signal provided by the conversion element. This application is directed more specifically to the protection of such a sensor against a blooming capable of damaging its pixels. The embodiments described in the following are particularly advantageous in cases where the conversion elements of the pixels are microbolometers.

PRESENTATION OF THE PRIOR ART

A bolometer traditionally comprises an absorber adapted to transform electromagnetic radiation to which it is subjected, generally located in the infrared, into thermal energy, and a thermometer that is linked thermally to the absorber and adapted to provide an electrical signal representative of the temperature of the absorber. The thermometer generally comprises a thermistor and a read circuit for reading the electrical resistance of the thermistor.

A thermal radiation sensor has already been proposed, for example in the French patent application no. 2796148 filed Jul. 8, 1999 or in the French patent application no. 2822541 filed Mar. 21, 2001, comprising a plurality of pixels arranged in and on a semiconductor substrate, each pixel comprising a microbolometer and an electronic monitor and read circuit for monitoring and reading the microbolometer.

A problem that emerges is that when they are subjected to high radiation, for example laser radiation in the case of a malicious attack on the sensor, or solar radiation, the pixels of such a sensor are subjected to an increase in temperature potentially reaching several hundred degrees, which can cause temporary or permanent damage.

More generally, this problem of a critical increase in the temperature of the pixels due to the radiation to be detected can arise in other types of electromagnetic radiation sensors, in particular sensors in which the measurement of the incident radiation is based on a conversion of the radiation into thermal energy within the pixels of the sensor.

It would be desirable to be able to have a means of protecting a radiation sensor against a blooming capable of damaging its pixels.

SUMMARY

Thus, one embodiment provides a radiation sensor comprising a plurality of pixels formed in and on a semiconductor substrate, each pixel comprising a microboard suspended above the substrate by thermal insulation arms, the microboard comprising:

a conversion element for converting incident electromagnetic radiation into thermal energy; and a passive optical shutter comprising a heat-sensitive layer covering one of the faces of the conversion element, the heat-sensitive layer having a reflection coefficient for the radiation to be detected that increases as a function of its temperature.

According to an embodiment, the heat-sensitive layer is made of a phase-change material.

According to an embodiment, the heat-sensitive layer is made of a metal oxide having an insulating phase that is transparent for the radiation to be detected and a metal phase that is reflective for the radiation to be detected.

According to an embodiment, the heat-sensitive layer is made of a vanadium oxide or a titanium oxide.

According to an embodiment, the heat-sensitive layer is made of $Ag_2S$ or of FeS.

According to an embodiment, the heat-sensitive layer has a transition temperature comprised between 60 and 180° C.

According to an embodiment, each pixel further comprises a thermistor that is thermally coupled to the conversion element of the pixel.

According to an embodiment, each pixel further comprises a read circuit for reading the value of the thermistor of the pixel.

According to an embodiment, in each pixel, the conversion element is a layer made of a material that is absorbent for the radiation to be detected.

According to an embodiment, in each pixel, the conversion element is a metal layer.

According to an embodiment, in each pixel, the thermal insulation arms lie on vertical electrical connection posts.

According to an embodiment, in each pixel, the microboard and the thermal insulation arms are disposed in a cavity closed by a cap that is transparent for the radiation to be detected.

According to an embodiment, in each pixel, the transparent cap hermetically closes the cavity, and the cavity has a pressure that is lower than the atmospheric pressure.

According to an embodiment, in each pixel, the microboard and the thermal insulation arms are disposed in a cavity closed by a cap that is transparent for the radiation to be detected.

According to an embodiment, in each pixel, the transparent cap hermetically closes the cavity, and the cavity has a pressure that is lower than the atmospheric pressure.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 7bis is a sectional view depicting a variant embodiment of the method of FIGS. 7A, 7B, 7C, 7D, 7E and 7F;

DETAILED DESCRIPTION

Like features have been designated by like references in the various figures and, in addition, the various figures are not drawn to scale. For the sake of clarity, only the elements that are useful for an understanding of the described embodiments have been illustrated and described in detail. In particular, the monitor and read circuits for monitoring and reading the pixels have not been described in detail, the described embodiments being compatible with monitor and read circuits usually provided in pixels of this type, or the realisation of these circuits being within the capabilities of those skilled in the art based on the functional indications of the present disclosure. In addition, in the figures illustrating the described examples, a sole pixel of a radiation sensor is visible. In practice, the radiation sensors can comprise a plurality of identical or similar pixels arranged in and on a same semiconductor substrate, for example according to a matrix arrangement or as a strip. The arrangement of the various pixels of the sensor, the interconnections between the pixels of the sensor, and the peripheral monitor circuits for monitoring the sensor have not been described in detail, the described embodiments being compatible with the arrangements, interconnections, and peripheral monitor circuits usually provided in such sensors. Furthermore, the uses that can be made of the described sensors have not been described in detail, the described embodiments being compatible with conventional applications of radiation sensors. It should be noted, however, that the described embodiments are particularly advantageous for applications in infrared imaging, thermal imaging, gas detection by measurement of the optical absorption in the infrared spectrum, the detection or recognition of persons, objects or movements in the infrared spectrum, etc. In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation of the sectional views shown in the figures, it being understood that, in practice, the described embodiments can have a different orientation. Unless specified otherwise, the expressions "approximately", "substantially" and "in the order of" signify within 10%, and preferably within 5%. It should be noted that, in the following description, the radiation sensors are intended to be illuminated or irradiated via their upper face (in the orientation of the sectional views of the figures).

First Embodiment—Active Protection on Cap

Figure 1A:
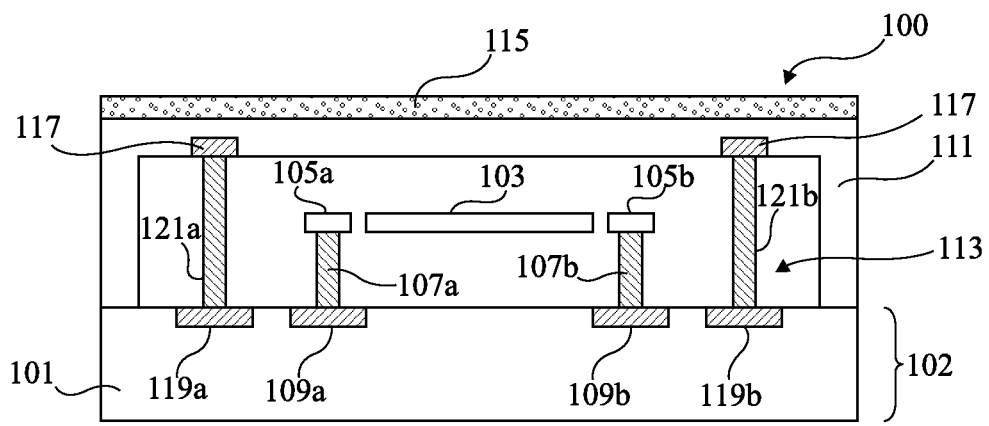
FIGS. 1A and 1B are respectively a simplified sectional view and a simplified top view of an example of a pixel of a radiation sensor according to a first embodiment.
Figure 1B:
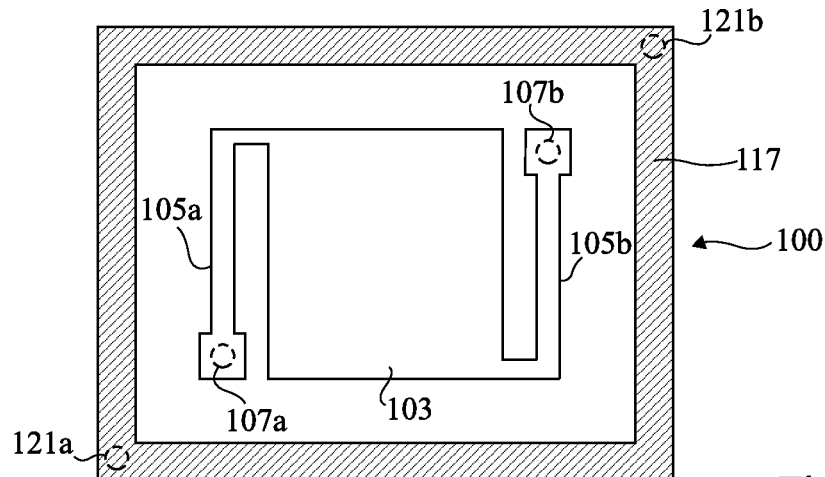

FIGS. 1A and 1B are respectively a simplified sectional view and a simplified top view of an example of a pixel of a radiation sensor according to a first embodiment.

The pixel 100 of FIGS. 1A and 1B is formed in and on a semiconductor substrate 101, for example made of silicon.

The pixel 100 comprises an electronic read and monitor circuit 102 formed in and on the substrate 101, for example using CMOS technology. The monitor and read circuit is not shown in detail in the figures. Only electrical connection pads flush with the upper face of the circuit 102, which are intended to connect the circuit 102 to other elements of the pixel, are illustrated in FIG. 1A in the form of hatched rectangular zones.

The pixel 100 further comprises a microboard 103 suspended above the circuit 102 by thermal insulation arms, which are two arms 105a and 105b in the illustrated example. More specifically, in the illustrated example, the substrate 101 and the circuit 102 are disposed horizontally, and the microboard 103 and the thermal insulation arms 105a and 105b are disposed in a same intermediate plane substantially parallel to the upper face of the circuit 102. Each of the arms 105a and 105b has a first end or proximal end mechanically and electrically in contact with the microboard 103, and a second end or distal end lying on the top of a vertical conductive post 107a, respectively 107b, for example made of copper or of tungsten, the base of which lies on the upper face of the circuit 102. The posts 107a and 107b mechanically support the microboard 103 by way of the arms 105a and 105b, and make it possible to connect the microboard 103 electrically to the circuit 102, also by way of the arms 105a and 105b. Thus, a space free of any solid material is located between the upper face of the circuit 102 and the lower face of the microboard 103. In other words, the microboard 103 is in mechanical contact solely with the arms 105a and 105b, which thermally isolate the microboard from the rest of the structure and in particular from the circuit 102 and from the substrate 101.

In this example, the microboard 103 is a bolometric microboard, i.e. it comprises an absorber (not shown in detail in FIGS. 1A and 1B), for example in the form of a conducting layer, adapted to convert incident electromagnetic radiation into thermal energy, and a thermistor (not shown in detail in FIGS. 1A and 1B) by means of which it is possible to measure the temperature of the absorber. For instance, the absorber is made of titanium nitride (TiN) and the thermistor is made of amorphous silicon or of vanadium oxide. The two ends of the thermistor are respectively electrically connected to the conductive posts 107a and 107b by way of the arms 105a and 105b.

In the illustrated example, the base of the support post 107a is mechanically and electrically in contact with a connection pad 109a of the upper face of the circuit 102, and the base of the support post 107b is mechanically and electrically in contact with a connection pad 109b of the upper face of the circuit 102. The monitor and read circuit 102 is thus connected to the ends of the thermistor of the pixel by way of the pads 109a and 109b and the posts 107a and 107b of the pixel. The circuit 102 is adapted to provide an electrical signal representative of the value of the electrical resistance of the thermistor of the pixel.

The pixel 100 further comprises a cap 111 that is transparent to the radiation to be detected, lying on the upper face of the monitor circuit 102 and delimiting, with the upper face of the circuit 102, a cavity or hermetic enclosure 113 in which the suspended microboard 103 is located. A space left free of any solid material is located between the upper face of the microboard 103 and the lower face of the cap 111, this space communicating with the free space located between the lower face of the microboard 103 and the upper face of the circuit 102. The cavity 113 is preferably placed under a vacuum or under a pressure lower than the atmospheric pressure, so as to reinforce the thermal isolation of the microboard 103 vis-à-vis the rest of the sensor, by limiting thermal conduction by air.

According to an aspect of the embodiment of FIGS. 1A and 1B, the pixel 100 comprises an optical shutter comprising a layer 115 made of a heat-sensitive material covering the upper face of the transparent cap 111, facing the microboard 103 of the pixel. The optical shutter is an active shutter, i.e. it is electrically controllable either in an open state in which the layer 115 is substantially transparent for the radiation to be detected, i.e. in which the reflection and/or absorption coefficient of the layer 115 for the radiation to be detected is relatively low, or in a closed state in which the reflection and/or absorption coefficient of the layer 115 for the radiation to be detected is relatively high, i.e. higher than its reflection and/or absorption coefficient in the open state. For instance, the radiation to be detected is thermal infrared radiation with a wavelength comprised in the band running from 8 to 14 µm, and the transmission coefficient of the layer 115 for the radiation to be detected in the closed state is lower than its transmission coefficient in the open state by at least 0.2 and preferably by at least 0.4.

In the example of FIGS. 1A and 1B, the shutter comprises a heating resistor 117 thermally coupled to the layer 115 and connected to the monitor circuit 102 for monitoring the pixel via connection pads 119a and 119b of the circuit 102.

In the illustrated example, the heating resistor 117 is disposed, when viewed from above, at the outer edge of the bolometric microboard 103, so as not to disrupt the passage of the incident electromagnetic radiation toward the microboard when the shutter is in the open state. For instance, the heating resistor 117 is a metal strip forming a conductive band surrounding, when viewed from above, the microboard 103. As a variant, the heating resistor can be realized from a material that is transparent for the radiation to be detected, for example a dielectric or semiconducting material, for example, in the case of an infrared radiation detector, from vanadium dioxide ($VO_2$), from germanium (Ge), or an a-SiGe:B alloy of amorphous silicon and germanium doped with boron. In this case, the heating resistor 117 can extend at least partly across from the bolometric microboard 103 of the pixel.

The heating resistor 117 is, for example, disposed under the heat-sensitive layer 115, for example joined to the lower face of the transparent cap 111. In the illustrated example, the heating resistor 117 is connected to the pads 119a and 119b of the monitor circuit 102 respectively by vertical conductive posts 121a and 121b, for example made of copper or of tungsten, which couple the lower wall to the upper wall of the cavity 113.

For the sake of simplification, only the microboard 103, the holding arms 105a and 105b, the heating resistor 117, and the vertical connection posts 107a, 107b, 121a and 121b of the pixel 100 have been illustrated in FIG. 1B. In addition, in FIG. 1A, the vertical connection posts 107a, 107b, 121a and 121b have been illustrated in a same plane. In practice, the posts 107a, 107b, 121a and 121b, however, are not necessarily aligned.

The anti-blooming protection of the pixel 100 operates as follows. The read circuit 102 of the pixel is adapted to detect a blooming capable of damaging the pixel, by way of its connection pads 109a and 109b, for example by detecting a variation in the value of the thermistor of the pixel that is too rapid and intense, a sign of an increase in the temperature of the microboard that is too rapid, or when the value of the thermistor reaches a predefined threshold.

For instance, the monitor and read circuit 102 is adapted, during an acquisition phase for acquiring a value representative of the electromagnetic radiation received by the pixel, to implement a reading of the pixel by integrating, in a capacitive element of the circuit 102, a current output by the thermistor of the microbolometer of the pixel for a given direct bias voltage of the thermistor.

In a preferred embodiment, the circuit 102 is configured to integrate the current output by the thermistor of the pixel during two successive integration periods of different durations. More specifically, the circuit 102 is adapted to measure the integrated current during a short integration period, for example of a duration comprised between 1 and 5 µs, in order to detect a potential blooming of the pixel, then during a long integration period, for example in the order of 30 to 100 µs, for example of approximately 64 µs, for the actual acquisition of a value representative of the radiation received by the pixel (or output value of the pixel), for example for the purpose of constructing an image. The signal derived from the first integration can be sampled and compared to a threshold, for example by a comparator, the shutter thus being controlled as a function of the result of the comparison.

As a variant, before the implementation of the long integration period, the circuit 102 can be adapted to integrate the current output by the thermistor during two successive short integration periods of different durations, for example during a first period in the order of 1 µs and during a second period in the order of 5 µs. The difference between the signals derived from the first and second short integration periods is thus determined and compared to a threshold in order to decide whether or not to activate the shutter. An advantage is that, by this means, it is possible to get away from the differences in values between the thermistors of the various pixels, linked to the technological dispersions, and thus to improve the precision of the detection of a blooming.

In a further variant, the monitor and read circuit 102 is adapted, during an acquisition phase for acquiring a value representative of the electromagnetic radiation received by the pixel, to implement a reading of the pixel by measuring the voltage at the terminals of the thermistor of the microbolometer of the pixel for a given direct bias current injected into the thermistor of the pixel. The voltage at the terminals of the thermistor can thus be compared to a threshold in order to decide whether or not to activate the shutter of the pixel.

When a blooming is detected, the circuit 102 controls the application of a current in the resistor 117, so as to cause an increase in temperature of the heat-sensitive layer 115 up to a transition temperature which brings about a switching of the shutter from the open state (layer 115 that is transparent to the radiation to be detected) to the closed state (layer 115 that is opaque for the radiation to be detected). The incident electromagnetic radiation is thus stopped or limited by the layer 115, by which means it is possible to avoid or limit a damaging of the bolometric microboard of the pixel. After a predetermined closing period or when the circuit 102 detects a return to a predetermined acceptable temperature of the bolometric microboard, the circuit 102 interrupts the current flowing in the heating resistor 117. The temperature of the heat-sensitive layer 115 is thus brought back down below its transition temperature, so that the shutter reopens.

It should be noted that, by means of the electrical connection posts 121a and 121b, it is advantageously possible to thermally couple the upper part of the protective cap 111 to the substrate 101, so as to contain the increase in temperature produced by the heating resistor 117, and to avoid that the heat produced by the resistor 117 spreads in the encapsulation caps and/or in the heat-sensitive layers of the adjacent pixels. In order to improve the thermal coupling with the substrate 101, the number of vertical electrical connection posts between the resistor 117 and the circuit 102 can be greater than two. For instance, in the case of a bolometric microboard 103 with a general square or rectangular shape and a heating resistor 117 in the form of a square or rectangular annular strip surrounding, when viewed from above, the microboard 103, as illustrated in FIG. 1B, the pixel can comprise four electrical connection posts respectively disposed, when viewed from above, at the four corners of the conductive annular strip forming the heating resistor.

Furthermore, the monitor and read circuit 102 for monitoring and reading the pixel 100 can be adapted to regulate the current injected into the heating resistor 117 as a function of the operational temperature of the sensor, so as to inject into the resistor 117 solely the current necessary for bringing about the closing of the shutter. Indeed, the operational temperature of a radiation sensor can generally vary within a wide range, for example running from −40° C. to +70° C., and the current to be injected into the resistor 117 in order to bring about the transition of the heat-sensitive layer 115 is all the higher when the operational temperature is low. For instance, the sensor comprises at least one temperature probe, for example disposed in and on the semiconductor substrate 101, for example a probe based on pn-junctions. The monitor and read circuit 102 for monitoring and reading the pixel 100 is thus adapted, in the event of a blooming of the pixel, to inject into the heating resistor 117 of the pixel a current chosen as a function of the temperature measured by the temperature probe. An advantage is that, by this means, it is possible to limit the electrical consumption linked to the anti-blooming protection, in particular when the sensor is used at high temperatures, and to avoid an unnecessary increase in temperature of the encapsulation cap 111 of the pixels beyond the transition temperature of the heat-sensitive layer.

The material of the heat-sensitive layer 115 is, for example, a phase-change material having, below a transition temperature, a phase that is substantially transparent for the radiation to be detected, and, above the transition temperature, a phase that is reflective or absorbent for the radiation to be detected. The transition temperature of the heat-sensitive material is preferably chosen to be higher than the maximum temperature that the cap 111 of the pixel can reach during normal operation, for example comprised between 60 and 180° C. The variation of the transmission or reflection coefficient of the heat-sensitive layer around the transition temperature is preferably relatively steep, for example greater than 2.5% per degree for a wavelength of 10 μm. For instance, the heat-sensitive material is a crystallised metal oxide having an insulating phase that is transparent below its transition temperature, and a metal phase that is reflective above its transition temperature. The heat-sensitive material is, for example, crystallised vanadium dioxide ($VO_2$), having a transition temperature in the order of 68° C. As a variant, the heat-sensitive material is vanadium dioxide crystallised and doped by low-valence cations, for example $Al3+$, $Cr3+$ or $Ti4+$, so as to increase its transition temperature. More generally, according to the desired transition temperature, other vanadium oxides can be used, for example $V_3O_5$. As a variant, the heat-sensitive material of the layer 115 is $Ti_3O_5$, $Ti_2O_3$, or $SmNiO_3$. As a variant, the heat-sensitive material of the layer 115 is a rare earth nickelate with the general composition $RNiO_3$, where R designates a rare earth or a binary alloy of rare earth, for example a compound of the type $Sm_xNd_{1-x}NiO_3$ or $Eu_xSm_{1-x}NiO_3$. As a variant, the heat-sensitive material of the layer 115 is $Ag_2S$ or FeS. As a variant, the heat-sensitive material is single-crystal germanium, which has the advantage of being relatively transparent for a thermal infrared radiation at room temperature, and relatively absorbent for this radiation at temperatures higher than 100° C.

Figure 2:
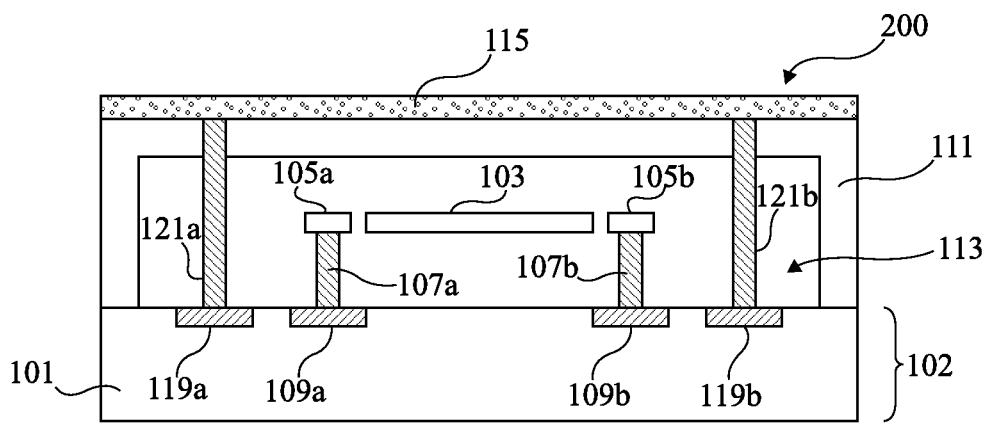
FIG. 2 is a simplified sectional view of a further example of a pixel of a radiation sensor according to the first embodiment.

FIG. 2 is a simplified sectional view of a further example of a pixel of a radiation sensor according to the first embodiment. The pixel 200 of FIG. 2 comprises elements in common with the pixel 100 of FIGS. 1A and 1B. These elements will not be described again in detail in the following. In the following, only the differences between the pixels 100 and 200 will be described in detail.

The pixel 200 of FIG. 2 differs from the pixel 100 of FIGS. 1A and 1B principally in that it does not comprise a heating resistor 117 separate from the heat-sensitive layer 115 for controlling the transitions to the closed state or to the open state of the layer 115. In this example, the upper ends of the connection posts 121a and 121b of the pixel are in direct electrical contact with the heat-sensitive layer 115.

The pixel 200 of FIG. 2 operates in substantially the same manner as the pixel 100 of FIGS. 1A and 1B, with the exception that, in the example of FIG. 2, when the monitor and read circuit 102 for monitoring and reading the pixel detects a blooming, it injects an electrical current directly into the heat-sensitive layer 115, by way of the connection pads 119a and 119b and connection posts 121a and 121b. This current causes an increase in temperature of the heat-sensitive layer 115, which leads to the closing of the shutter. When the current flowing in the heat-sensitive layer 115 is interrupted, the temperature of the layer 115 is brought back down below its transition temperature, so that the shutter returns to the open state.

FIGS. 3A, 3B, 3C, 3D, 3E and 3F are sectional views depicting steps of an example of a method for manufacturing a radiation sensor of the type described in relation to FIG. 2, i.e. not comprising a heating resistor separate from the heat-sensitive layer for controlling the transitions to the closed state or to the open state of the heat-sensitive layer. FIGS. 3A, 3B, 3C, 3D, 3E and 3F depict more specifically the realisation of a single pixel of the sensor, it being understood that, in practice, a plurality of identical or similar pixels can be formed simultaneously in and on a same semiconductor substrate 101.

Figure 3A:
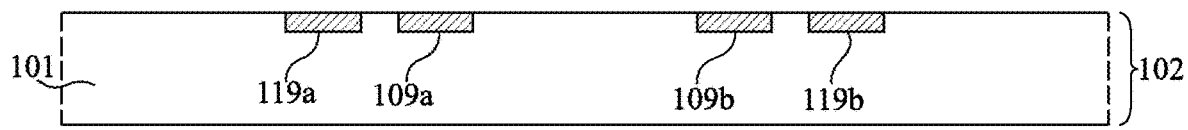
FIGS. 3A, 3B, 3C, 3D, 3E and 3F are sectional views depicting steps of an example of a method for manufacturing a pixel according to the first embodiment.

FIG. 3A depicts a step of manufacturing the monitor and read circuit 102 for monitoring and reading the pixel 200, in and on the substrate 101. The circuit 102 is, for example, realised using CMOS technology. The manufacture of the circuit 102 is not described in detail here, the realisation of this circuit being within the capabilities of those skilled in the art based on the functional description indicated above. In FIG. 3A, only the electrical connection pads 109a, 109b, 119a and 119b of the circuit 102, which are flush with the upper face of the circuit 102, have been illustrated.

Figure 3B:
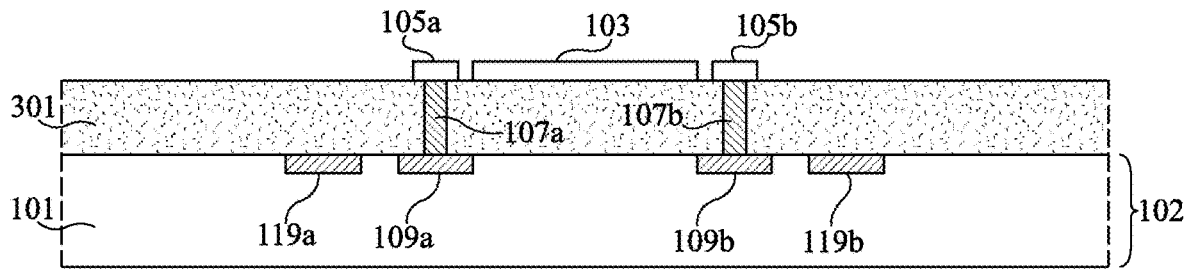

FIG. 3B depicts a step of depositing a sacrificial layer 301 on and in contact with the upper face of the circuit 102. The layer 301 is, for example, deposited in a continuous manner along substantially the entire surface of the substrate 101. For instance, the layer 301 is made of polyimide or of silicon oxide. The thickness of the layer 301 sets the distance between the upper face of the circuit 102 and the bolometric microboard 103 of the pixel 200. For instance, the layer 301 has a thickness comprised between 1 and 5 µm, for example in the order of 2.5 µm.

FIG. 3B further depicts the formation of the electrical connection posts 107a and 107b of the pixel, in vias etched in the sacrificial layer 301 in vertical alignment with the connection pads 109a and 109b of the circuit 102. The posts 107a and 107b extend vertically along substantially the entire thickness of the layer 301, from the upper face of the connection pads 109a and 109b of the circuit 102, up to the upper face of the layer 301.

FIG. 3B additionally depicts the formation of the bolometric microboard 103 and of the holding arms 105a, 105b of the microboard, on and in contact with the upper face of the sacrificial layer 301 and of the connection posts 107a and 107b. This step comprises the deposition of the constituent materials of the bolometric microboard 103 and of the holding arms 105a, 105b, and the delimitation or individualisation of the microboard 103 and arms 105a, 105b of the pixel. The formation of the bolometric microboard 103 and of the holding arms 105a, 105b is not described in detail here, this formation potentially being implemented by methods known to those skilled in the art, for example methods of the type described in the aforementioned French patent application nos. 2796148 and 2822541.

Figure 3C:
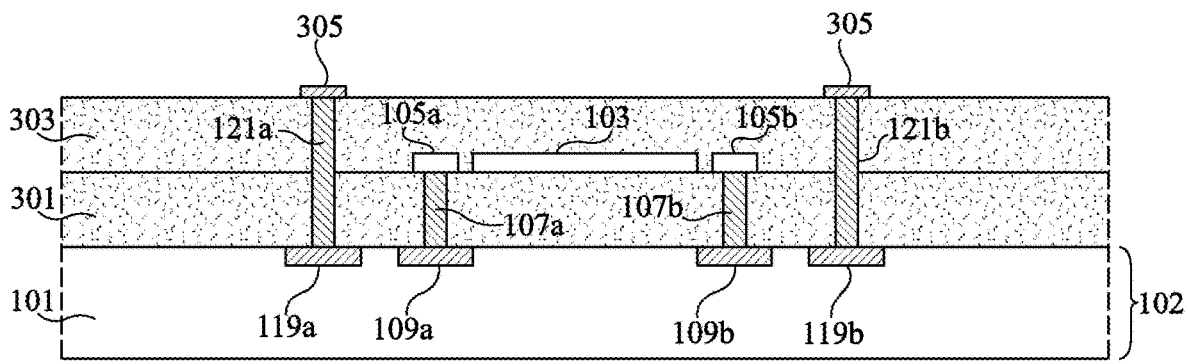

FIG. 3C depicts a step of depositing, on and in contact with the upper face of the structure obtained at the end of the steps of FIG. 3B, of a second sacrificial layer 303, preferably of the same nature as the layer 301. The layer 303 is, for example, deposited in a continuous manner along substantially the entire surface of the sensor. The lower face of the layer 303 is in contact with the upper face of the microboards 103 and of the holding arms 105a, 105b of the pixels, and, with the upper face of the layer 301 in the areas separating, when viewed from above, the microboards 103 and the arms 105a, 105b of the pixels. The thickness of the layer 303 sets the distance between the upper face of the microboard 103 and the upper part of the encapsulation cap of the pixel. For instance, the layer 303 has a thickness comprised between 1 and 2.5 µm.

FIG. 3C further depicts the formation of the electrical connection posts 121a and 121b of the pixel, in vias etched in the sacrificial layers 303 and 301 in vertical alignment with the connection pads 119a and 119b of the circuit 102. The posts 121a and 121b extend vertically along substantially the entire thickness of the sacrificial layers 303 and 301, from the upper face of the connection pads 119a and 119b of the circuit 102, until the upper face of the layer 303. For instance, the connection posts 121a, 121b have a surface cross section comprised between 0.25 and 1 µm2.

FIG. 3C additionally depicts the formation of a conducting layer 305 localised on the upper surface of the electrical connection posts 121a and 121b. The role of the layer 305 is in particular to prevent the diffusion of the metal of the posts 121a, 121b, for example of the copper or of the tungsten, into the material of the encapsulation cap of the pixel. The layer 305 can further act as a layer for stopping an etching during a subsequent step of establishing contact on the posts 121a, 121b. For instance, the layer 305 is made of titanium nitride (TiN). The layer 305 has, for example a thickness comprised between 20 and 80 nm.

Figure 3D:
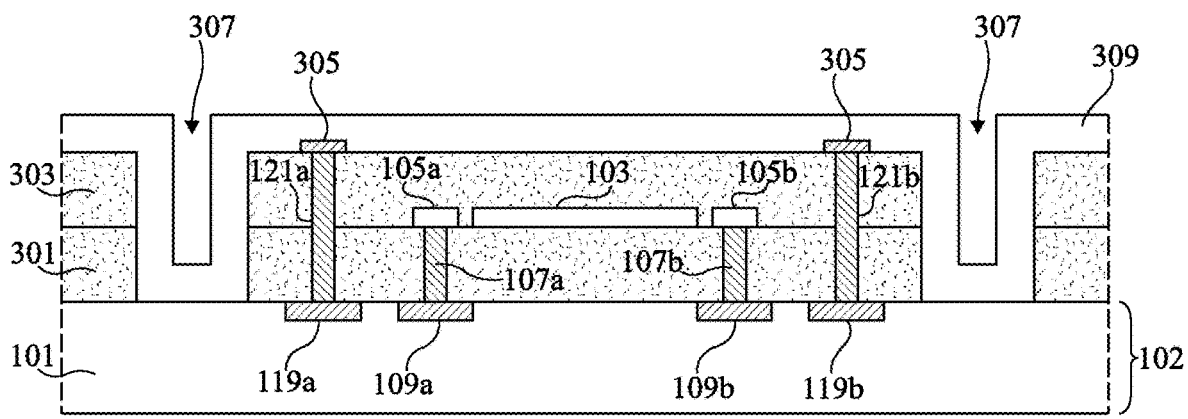

FIG. 3D depicts a step that is later than the steps of FIG. 3C, during which a vertical peripheral trench entirely surrounding, when viewed from above, the assembly comprising the bolometric microboard 103, the holding arms 105a, 105b and the electrical connection posts 107a, 107b, 121a, 121b, is etched from the upper face of the sacrificial layer 303 and until the upper face of the circuit 102. The trench 307 separates the elements 103, 105a, 105b, 107a, 107b, 121a, 121b of the pixel from the corresponding elements of adjacent pixels. The trench 307 is intended to receive the lateral walls of the encapsulation cap of the pixel. In this example, a specific trench 307 is realised for each pixel of the sensor, i.e. two adjacent pixels are separated by two separate trenches 307.

FIG. 3D further depicts a step of depositing a layer 309 that is transparent for the radiation to be detected along substantially the entire upper surface of the structure obtained after the etching of the trenches 307, in order to form the encapsulation caps 111 of the pixels of the sensor. The layer 309 is, for example, a layer of amorphous silicon with a thickness of 0.5 to 1 µm, for example a thickness in the order of 0.8 µm. The layer 309 is in particular deposited on and in contact with the lateral walls and the bottom of the trenches 307, as well as on and in contact with the upper face of the sacrificial layer 303 or of the barrier layer 305 outside the trenches 307, so as to encapsulate hermetically, in each pixel, the assembly comprising the microboard 103, the arms 105a, 105b, and the posts 107a, 107b, 121a, 121b of the pixel.

Figure 3E:
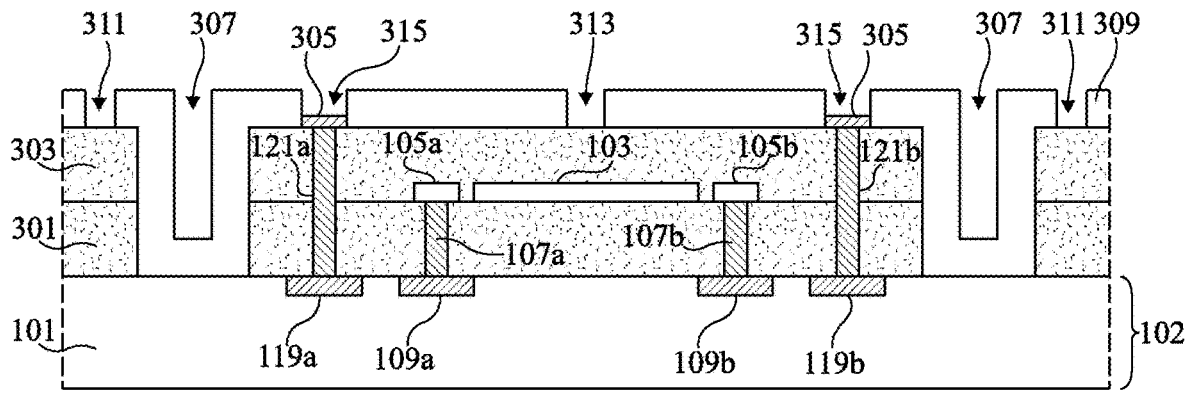

FIG. 3E depicts a step of etching, in the layer 309, of trenches 311 entirely surrounding, when viewed from above, each of the pixels of the sensor so as to individualise and electrically insulate the encapsulation caps 111 of the various pixels of the sensor. Indeed, in cases where the material of the layer 309 is electrically conductive, which can be the case with amorphous silicon if it is doped, it is preferable to electrically insulate the encapsulation caps 111 of the various pixels, so that the bias applied by the monitor and read circuit 102 for monitoring and reading a pixel by way of its connection posts 121a, 121b does not cause the flow of a parasitic current in the array of encapsulation caps of the sensor. In the illustrated example, the trenches 311 are disposed, when viewed from above, in the gaps separating the trenches 307 from the adjacent pixels of the sensor. The isolation trenches 311 extend vertically along the entire thickness of the layer 309, and end at the upper face of the sacrificial layer 303.

FIG. 3E further depicts a step of etching, in each pixel, at least one opening 313 in the layer 309, inside the zone delimited (when viewed from above) by the trench 307, i.e. in the upper part of the encapsulation cap 111 of the pixel, for example facing a central part of the microboard 103 of the pixel. The opening 313 is provided to make the implementation of a subsequent step of removing the sacrificial layers 301 and 303 inside the cap 111 possible. The opening 313 extends vertically along the entire thickness of the layer 309, and ends at the upper face of the sacrificial layer 303. The width of the opening 313, when viewed from above, is, for example, comprised between 0.1 and 1 µm.

FIG. 3E additionally depicts a step of etching openings 315 in the layer 309, located across from the electrical connection posts 121a, 121b so as to free up the access to the upper face of the barrier layer 305.

The openings 311, 313 and 315 are, for example, realised simultaneously during a same etching step.

Figure 3F:
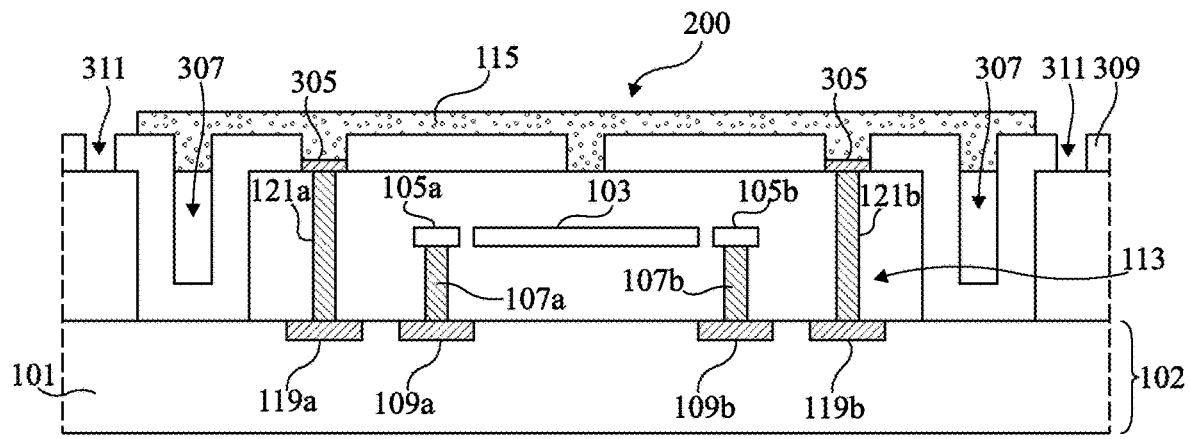

FIG. 3F depicts a subsequent step of removing the sacrificial layers 303 and 301, for example by anisotropic chemical etching, so as to free up the microboard 103 and the holding arms 105a, 105b of the pixel.

FIG. 3F further depicts a step, following the removal of the sacrificial layers 303 and 301, of depositing the heat-sensitive layer 115 on and in contact with the upper face of the encapsulation cap 111, across from the bolometric microboard 103 of the pixel. For instance, the heat-sensitive layer 115 is deposited along the entire upper surface of the structure, then etched across from the openings 311 so as to electrically isolate the portions of the layer 115 disposed on the various pixels of the sensor. Depending on the type of heat-sensitive material used, an annealing of the layer 115 can potentially be implemented in order to obtain the desired crystalline phase and transition temperature of the material. For instance, in the case of a heat-sensitive layer made of vanadium dioxide ($VO_2$), the deposition can be realised at room temperature by spraying a vanadium target in an atmosphere containing oxygen. This leads to the formation of a layer of amorphous vanadium dioxide. An annealing at a temperature in the order of 350 to 400° C. can then be implemented in order to crystallise the layer of vanadium oxide and to obtain the desired heat-sensitive properties. The heat-sensitive layer has, for example, a thickness comprised between 20 and 100 nm, for example between 20 and 60 nm.

At the openings 315, the heat-sensitive layer 115 enters into contact with the upper face of the conducting layer 305, so as to connect the heat-sensitive layer 115 electrically to the connection posts 121a and 121b. In the illustrated example, the heat-sensitive material of the layer 115 further plugs the opening 313 provided for the removal of the sacrificial layers 303 and 301, so as to ensure the hermetic closing of the encapsulation cavity 113 of the pixel. The deposition of the heat-sensitive layer 115 is, for example, realised under a vacuum or at a pressure lower than the atmospheric pressure so as to place under a vacuum or a low pressure the encapsulation cavity of the pixel. It should be noted that, by means of the germanium, it is advantageously possible to ensure the dual role of heat-sensitive layer and hermetic closing material of the opening 313. As a variant, if the heat-sensitive material is not adapted to plug the opening 313 hermetically, an intermediary step of depositing a material adapted to plug the opening 313, for example germanium, or a metal such as aluminium, can be provided before the deposition of the heat-sensitive layer 115. In cases where the intermediary layer for plugging the opening 113 is not sufficiently transparent for the radiation to be detected, the latter can be deposited in a localised manner solely across from the opening 113, or etched after its deposition so as to be retained solely across from the opening 113.

At the end of the step of FIG. 3F, a pixel 200 of the type described in relation to FIG. 2 is obtained.

Figure 4:
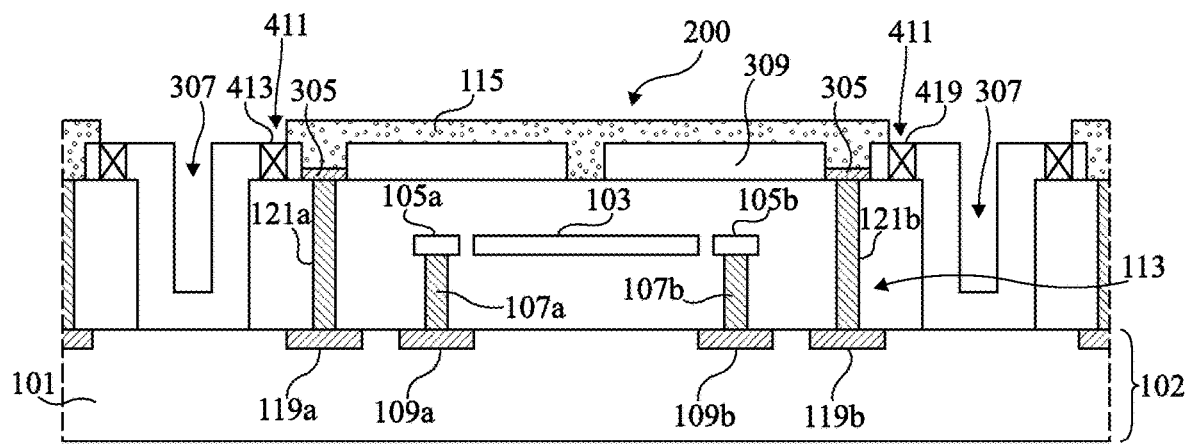
FIG. 4 is a sectional view depicting a variant of the manufacturing method of FIGS. 3A, 3B, 3C, 3D, 3E and 3F.

FIG. 4 depicts a variant of the method described in relation to FIGS. 3A, 3B, 3C, 3D, 3E and 3F. FIG. 4 is a sectional view of the pixel obtained at the end of the method corresponding to the sectional view of FIG. 3F.

The variant embodiment of FIG. 4 differs from the method described in the foregoing mainly by the manner of insulating the encapsulation caps 111 of the various pixels of the sensor.

The method of FIG. 4 comprises the same initial steps as the method described in the foregoing, up to and including the steps of FIG. 3C.

In the variant of FIG. 4, vertical delimitation trenches 307 for delimiting the pixels are etched in the sacrificial layers 303 and 301 from the upper face of the structure. These trenches are similar to what has been described in relation to FIG. 3D, with the exception that, in the variant of FIG. 4, two adjacent pixels of the sensor are separated by a single trench 307. In other words, contrary to the example of FIG. 3D in which an annular trench 307 specific to each pixel of the sensor is formed so that the trenches 307 of separate pixels are disjunct, in the example of FIG. 4, the trenches 307 have, when viewed from above, the shape of a continuous grid extending along substantially the entire surface of the sensor and delimiting the various pixels of the sensor.

The subsequent steps of the method of FIG. 4 are similar to what has been described in relation to FIGS. 3D and 3E, with the exception that, instead of the trench 311 of FIG. 3E, an annular trench 411 is etched in the layer 309, for each pixel, said annular trench 411 entirely surrounding, when viewed from above, the assembly comprising the bolometric microboard 103, the holding arms 105a, 105b and the electrical connection posts 107a, 107b, 121a, 121b of the pixel, the trench 411 being located, when viewed from above, inside the zone delimited by the delimitation trench 307 for delimiting the pixel. The annular trench 411 extends vertically along the entire thickness of the encapsulation layer 309, and ends at the upper face of the sacrificial layer 303. The trench 411 is then filled with an electrically insulating material, for example silicon nitride (SiN) or aluminium nitride (AlN), so as to obtain an insulating frame or ring 413 entirely surrounding an upper central part of the encapsulation cap 111 of the pixel, which prevents the flow of parasitic currents between the encapsulation caps of the various pixels of the sensor.

The subsequent steps are identical or similar to what has been described in relation to FIGS. 3E and 3F, the heat-sensitive layer 115 of each pixel being inserted, when viewed from above, inside the insulating frame or ring 413 of the pixel.

An advantage of the variant embodiment of FIG. 4 is that it makes it possible, at the price of an additional step of forming the insulating frame 413 in the opening 411, to reduce the surface area used for electrically insulating the encapsulation caps 111 and the heat-sensitive layers 115 of the various pixels of the sensor.

FIGS. 5A, 5B, 5C, 5D are sectional views depicting steps of an example of a method for manufacturing a radiation sensor of the type described in relation to FIGS. 1A and 1B, i.e. comprising a heating resistor separate from the heat-sensitive layer for controlling the transitions to the closed state or to the open state of the heat-sensitive layer. FIGS. 5A, 5B, 5C and 5D are directed more specifically to cases where the heating resistor is a conductive metal strip surrounding, when viewed from above, without masking, the bolometric microboard 103 of the pixel.

The method of FIGS. 5A, 5B, 5C, 5D comprises elements in common with the method described in relation to FIGS. 3A, 3B, 3C, 3D, 3E and 3F and/or in relation to FIG. 4. In the following, only the differences with the methods of FIGS. 3A, 3B, 3C, 3D, 3E, 3F and 4 will be described in detail.

The method of FIGS. 5A, 5B, 5C and 5D comprises the same initial steps as the method described in the foregoing, up to and including the steps of FIG. 3C.

Figure 5A:
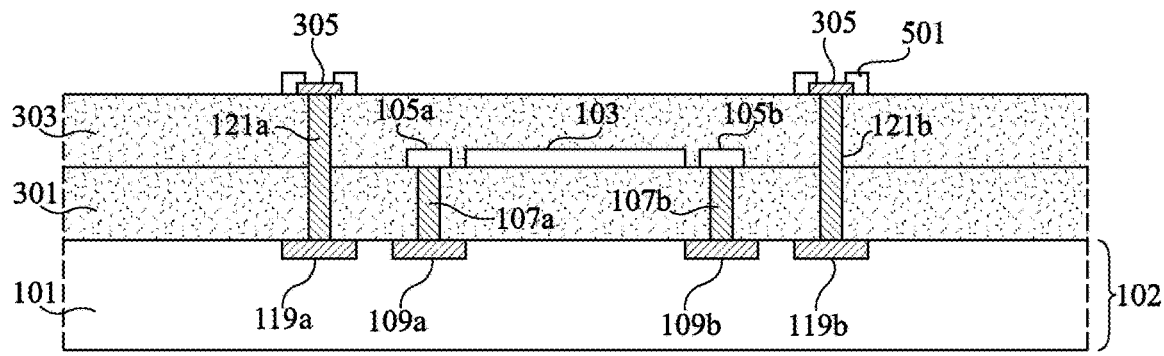
FIGS. 5A, 5B, 5C and 5D are sectional views depicting steps of a further example of a method for manufacturing a pixel according to the first embodiment.

FIG. 5A depicts a step of depositing a first electrically insulating layer 501, for example made of silicon nitride (SiN) or made of aluminium nitride (AlN), on the upper face of the structure obtained at the end of the steps of FIG. 3C. Openings are then etched in the layer 501 in vertical alignment with the electrical connection posts 121a, 121b, so as to free up the access to the upper face of the barrier layer 305. During this etching step, the layer 501 is retained at the outer edge and on the sides of the portions of the layer 305 deposited on the electrical connection posts 121a, 121b. The layer 501 is further retained along the entire surface of the structure intended to receive the heating resistor 117, so that, at the end of the method, the heating resistor 117 is entirely encapsulated in an electrically insulating sheath, except at its areas for electrical connection to the layer 305. The layer 501 can be removed from the rest of the surface of the structure, and in particular across from the bolometric microboard 103 of the pixel.

Figure 5B:
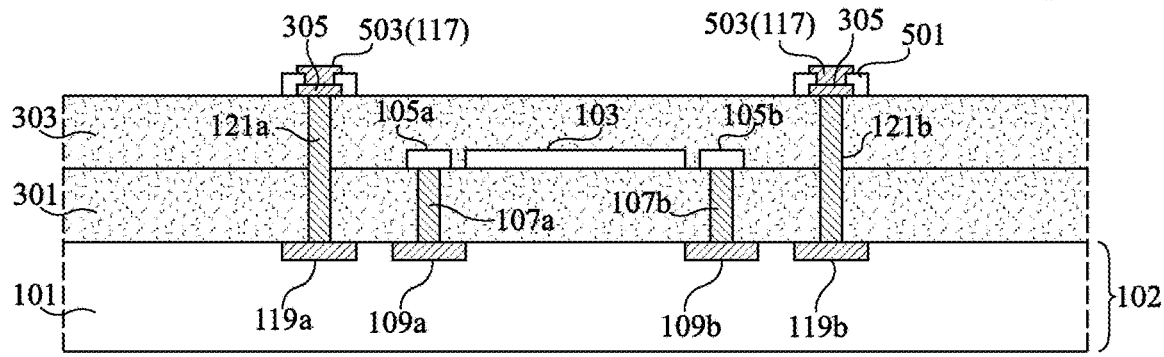

FIG. 5B depicts a subsequent step of depositing a conducting layer 503 on the upper face of the structure obtained at the end of the steps of FIG. 5A, in order to form the heating resistor 117 of the pixel. The layer 503 is, for example, a layer of aluminium, of titanium, or of titanium nitride. The layer 503 has, for example, a thickness comprised between 10 and 100 nm, for example a thickness in the order of 20 nm. For instance, the layer 503 is deposited along the entire upper surface of the structure, then etched in order to retain only a conductive strip 117 disposed on and in contact with the upper face of the insulating layer 501, surrounding, when viewed from above, the assembly comprising the bolometric microboard 103 and the connection arms 105a, 105b of the pixel, and electrically connected to the connection posts 121a, 121b of the pixel by way of the barrier layer 305. The width, when viewed from above, of the conductive strip 117 is, for example, comprised between 0.5 and 2 µm, for example in the order of 1 µm. For instance, when viewed from above, the conductive strip 117 has the general shape of a frame or square ring with sides of approximately 25 µm.

Figure 5C:
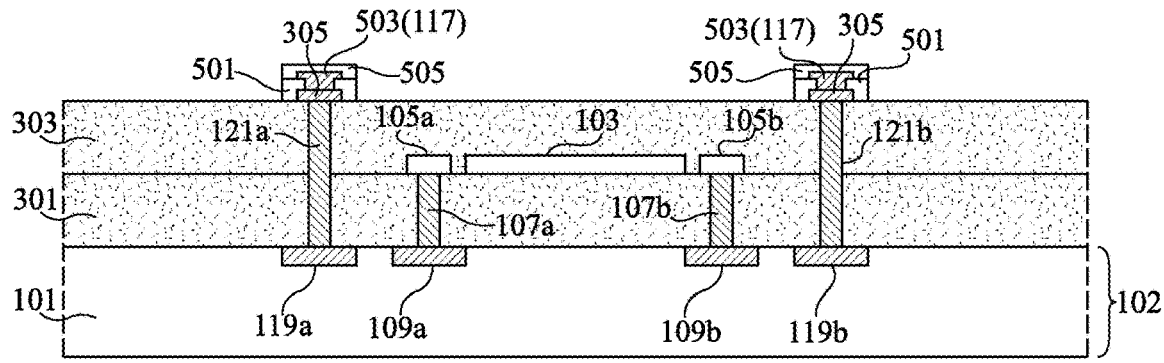

FIG. 5C depicts a step of depositing a second electrically insulating layer 505, for example of the same nature as the insulating layer 501, on the upper face of the structure obtained at the end of the steps of FIG. 5B. The layer 505 is disposed so as to cover the upper face and the sides of the conductive band forming the heating resistor 117, so as to form together with the layer 501 an insulating encapsulation sheath around the resistor 117. For instance, the layer 505 is first deposited along the entire upper surface of the structure, then etched so as to be retained across from the heating resistor 117 only. In particular, the layer 505 can be removed across from the bolometric microboard 103 of the pixel.

In a variant, the insulating layer 501 is not etched in the step of FIG. 5A, except from across from the electrical connection posts 121a, 121b. The layers 501 and 505 are then etched simultaneously during a same step subsequent to the formation of the conductive strip 117 and to the deposition of the layer 505.

The subsequent steps of the method are substantially identical to what has been described in the foregoing in relation to FIGS. 3D, 3E and 3F and/or in relation to FIG. 4. It should be noted, however that, due to the electrical insulation of the heating resistor 117 by the dielectric layers 501, 505, the steps of electrically insulating the encapsulation caps of the various pixels are optional.

Figure 5D:
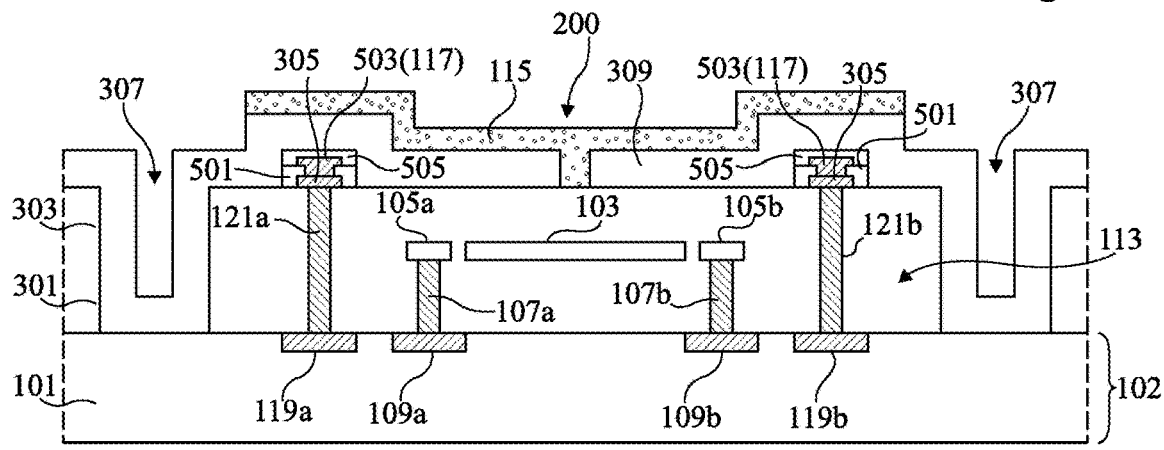

FIG. 5D illustrates the pixel obtained at the end of the method.

An advantage of the radiation sensors of the type described in relation to FIGS. 1A, 1B, 2, 3A to 3F, 4 and 5A to 5D is that each pixel of the sensor can be individually protected against a blooming, as a function of the measured increase in temperature of its bolometric microboard, without it being necessary to simultaneously shutter all the pixels of the sensor in order to implement the protection.

In addition, in the open state, the entire surface of the shutter across from the bolometric microboard is transparent for the radiation to be detected, so that the shutter does not attenuate or hardly attenuates the incident radiation.

Example embodiments in which each pixel comprises a bolometric microboard 103 disposed in a cavity specific to the pixel, closed hermetically by a cap 111 specific to the pixel, have been described in detail above. Those skilled in the art will be capable, however, of providing variants in which a plurality of bolometric microboards belonging to separate pixels are disposed in a same cavity closed by an encapsulation cap common to a plurality of pixels.

Furthermore, example embodiments have been described in relation to FIGS. 1A, 1B, and 5A to 5D in which a heating resistor 117 is disposed under the upper face of the encapsulation cap 111 of the pixel, in order to control the opening and the closing of the optical shutter. As a variant, the heating resistor 117 can be disposed above the upper face of the encapsulation cap 111 of the pixel, for example on the upper face of the heat-sensitive layer 115 or between the encapsulation cap 111 and the heat-sensitive layer 115.

In addition, example embodiments have been described in which the heat-sensitive layer 115 of the optical shutter is disposed on and in contact with the upper face or outside face of the encapsulation cap 111 of the pixel. As a variant, the heat-sensitive layer 115 can be disposed inside the cavity 113, in contact with the lower face of the upper part of the cap 111.

Furthermore, the sensors described in relation to FIGS. 1A, 1B, 2, 3A to 3F, 4 and 5A to 5D can comprise additional elements, not described in detail. In particular, an anti-reflection layer, for example a layer of zinc sulphide (ZnS), can be provided on the upper face of the pixels. Moreover, a layer that is reflective for the electromagnetic radiation to be detected can be provided under the bolometric microboard 103, on and in contact with the upper face of the monitor and read circuit 102 for monitoring and reading the pixel, so as to define a cavity that is resonant for the radiation to be detected between the bolometric microboard 103 and the upper face of the circuit 102.

Moreover, example embodiments have been described, in relation to FIGS. 1A, 1B, 2, 3A to 3F, 4 and 5A to 5D, in which each pixel of the sensor comprises a suspended microboard 103 comprising a microbolometer. As a variant, the microbolometer can be replaced by another type of conversion element for converting the incident electromagnetic radiation into an electrical signal, for example a heat detector or a detector based on the conversion of the incident radiation into thermal energy, for example a thermistor, a pyro-electric detector, or a detector based on field-effect transistors or based on pn diodes.

Second Embodiment—Passive Protection on Microboard

Figure 6:
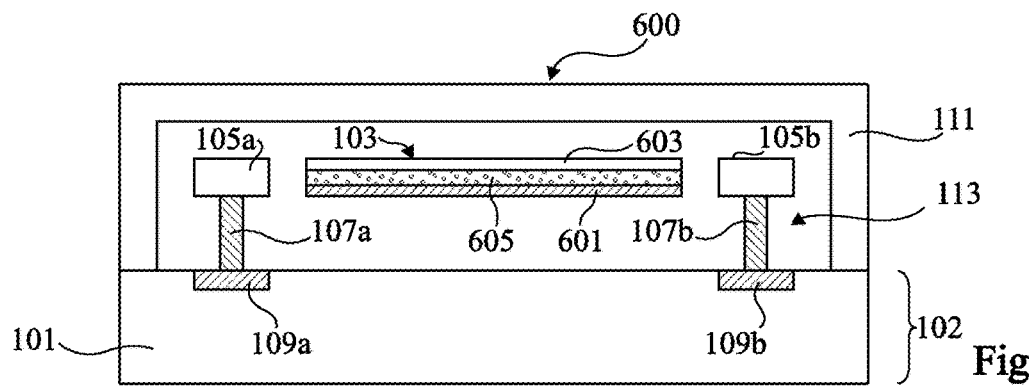
FIG. 6 is a partial and simplified sectional view of an example of a pixel of a radiation sensor according to a second embodiment.

FIG. 6 is a simplified sectional view of an example of a pixel 600 of a radiation sensor according to a second embodiment. The pixel 600 of FIG. 6 comprises elements in common with the pixels described in the foregoing. In the following, only the differences with respect to the examples of the first embodiment will be described in detail.

As in the examples described in the foregoing, the pixel 600 of FIG. 6 is formed in and on a semiconductor substrate 101, for example made of silicon, and comprises an electronic monitor and read circuit 102 formed in and on the substrate 101. In addition, as in the foregoing examples, the pixel 600 comprises a microboard 103 suspended above the circuit 102 by thermal insulation arms, two arms 105a and 105b in the illustrated example, and vertical conductive posts 107a, 107b coupled to connection pads 109a, 109b of the circuit 102. The pixel 600 can further comprise, as in the foregoing examples, a cap 111 that is transparent to the radiation to be detected, lying on the upper face of the monitor circuit 102 and delimiting, together with the upper face of the monitor circuit 102, a cavity or hermetic enclosure 113 in which the suspended microboard 103 is located. The cavity 113 can be placed under a vacuum or under a pressure lower than the atmospheric pressure so as to reinforce the thermal isolation of the microboard 103.

Unlike the examples of the first embodiment, the pixel 600 of FIG. 6 does not comprise an active optical shutter and in particular does not comprise a heat-sensitive layer covering a face of the transparent cap 111 across from the microboard 103 and connected to the monitor and read circuit 102 of the pixel. More specifically, in the example of FIG. 6, the pixel 600 does not comprise the connection posts 121a, 121b, the connection pads 119a, 119b, the heating resistor 117, and the heat-sensitive layer 115 of the examples of the first embodiment.

The microboard 103 of the pixel 600 comprises a conversion element for converting the incident electromagnetic radiation into thermal energy. In the illustrated example, the microboard 103 is a bolometric microboard, i.e. it comprises an absorber 601, for example in the form of a conducting layer, adapted to convert incident electromagnetic radiation into thermal energy, and a thermistor 603 by means of which it is possible to measure the temperature of the absorber. The absorber 601 takes, for example, the form of a layer extending along substantially the entire surface of the microboard. For instance, the absorber is made of titanium nitride (TiN). The thermistor 603 is realised from a material called thermometer material in the following, the electrical resistivity of which varies significantly as a function of temperature, for example amorphous silicon or vanadium oxide. For instance, the thermistor 603 takes the form of a layer covering substantially the entire surface of the microboard 103. Two ends of the thermistor are electrically connected to the monitor circuit for monitoring the pixel, by electric couplings not shown in detail in FIG. 6, passing via the arms 105a, 105b and the suspension posts 107a, 107b for suspending the microboard.

According to an aspect of the embodiment of FIG. 6, the microboard 103 of the pixel 600 comprises a passive optical shutter comprising a layer 605 made of a heat-sensitive material, covering the conversion element for converting the incident radiation into thermal energy of the pixel, namely the absorber 601 in this example. By passive shutter, a shutter is understood here that is not electrically controlled by the monitor and read circuit 102 of the pixel. In the embodiment of FIG. 6, the heat-sensitive layer 605 is thermally coupled to the conversion element for converting the incident radiation into thermal energy, and it is the heat produced by the conversion element that, when it becomes too high, directly causes a modification of the optical properties of the heat-sensitive layer, so as to decrease its transmission coefficient for the incident radiation. In this example, the heat-sensitive layer 605 is disposed between the absorber 601 and the thermistor 603. The heat-sensitive layer 605 is chosen so as to have a reflection coefficient that increases as a function of temperature. More specifically, the heat-sensitive layer 605 is chosen so as to be substantially transparent for the radiation to be detected below a transition temperature, and so as to have a reflection coefficient for the radiation to be detected that is relatively high above its transition temperature. The transition temperature of the heat-sensitive layer is preferably higher than the maximum temperature that the microboard 103 can reach during normal operation, and lower than the maximum temperature that the microboard 103 can endure before a damaging of the pixel. For instance, the transition temperature of the heat-sensitive layer is comprised between 60 and 180° C. the variation in the reflection or transmission coefficient of the heat-sensitive layer around the transition temperature is preferably relatively steep, for example greater than 2.5% per degree for a wavelength of 10 µm. In case of a blooming of the pixel, the shutter closes automatically as a result of the increase in temperature of the microboard. A part of the incident electromagnetic radiation is thus reflected by the layer 605, and is thus no longer absorbed by the conversion element of the pixel. This makes it possible to avoid or limit a damaging of the bolometric microboard of the pixel. When the temperature of the layer 605 is brought back down below its transition temperature, the shutter reopens.

The material of the heat-sensitive layer 605 is, for example, a phase-change material, for example a crystallised metal oxide that has an insulating phase that is transparent for the radiation to be detected below its transition temperature, and a metal phase that is reflective for the radiation to be detected above its transition temperature. The heat-sensitive material is, for example, crystallised vanadium dioxide ($VO_2$), having a transition temperature in the order of 68° C. As a variant, the heat-sensitive material is vanadium dioxide crystallised and doped by low-valence cations, for example $Al^{3+}$, $Cr^{3+}$ or $Ti_4+$, so as to increase its transition temperature. More generally, according to the desired transition temperature, other vanadium oxides can be used, for example $V_3O_5$. As a variant, the heat-sensitive material of the layer 605 is $Ti_3O_5$, $Ti_2O_3$, or $SmNiO_3$. As a variant, the heat-sensitive material of the layer 605 is a rare earth nickelate with the general composition $RNiO_3$, where R designates a rare earth or a binary alloy of rare earth, for example a compound of the type $Sm_xNd_{1-x}NiO_3$ or $Eu_xSm_{1-x}NiO_3$. As a variant, the heat-sensitive material of the layer 605 is $Ag_2S$ or FeS.

FIGS. 7A, 7B, 7C, 7D, 7E and 7F are sectional views depicting steps of an example of a method for manufacturing a radiation sensor of the type described in relation to FIG. 6. FIGS. 7A, 7B, 7C, 7D, 7E and 7F depict more specifically the realisation of a single pixel 600 of the sensor, it being understood that, in practice, a plurality of identical or similar pixels can be formed simultaneously in and on a same semiconductor substrate 101.

Figure 7A:
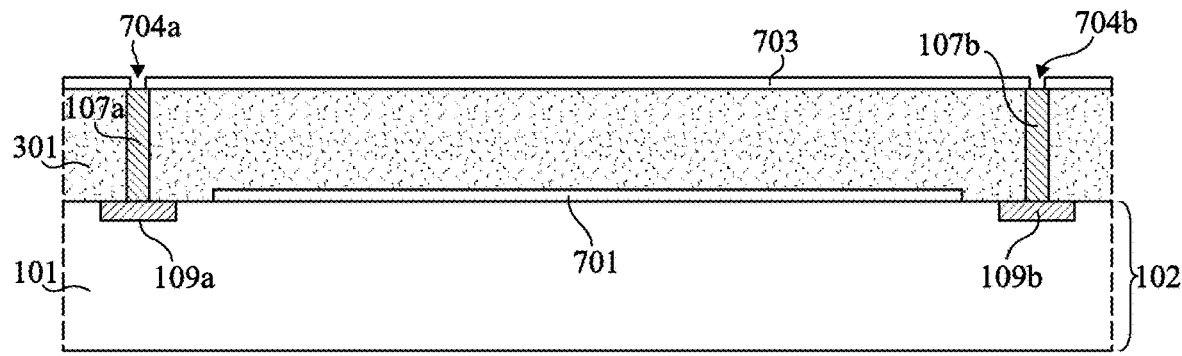
FIGS. 7A, 7B, 7C, 7D, 7E and 7F are sectional views depicting steps of an example of a method for manufacturing a pixel according to the second embodiment.

FIG. 7A depicts a step of manufacturing the monitor and read circuit 102 for monitoring and reading the pixel 600, in and on the substrate 101, for example using CMOS technology. In FIG. 7A, only the electrical connection pads 109a and 109b of the circuit 102, which are flush with the upper face of the circuit, have been illustrated.

FIG. 7A further depicts an optional step of forming, on the upper face of the circuit 102, a reflective layer 701, for example a layer of aluminium, of silver or of copper. This reflector, potentially also being provided in an optional manner in the examples of FIGS. 1A, 1B, 2, 3A to 3F, 4 and 5A to 5D, makes it possible to define a cavity that is resonant for the radiation to be detected, between the microboard 103 and the upper face of the circuit 102, so as to increase the absorption of the incident radiation by the microboard 103. For instance, the layer 701 is first deposited along the entire surface of the sensor, then etched so as to be retained across from the future microboard 103 of the pixel only.

FIG. 7A additionally depicts a step of depositing a sacrificial layer 301 on and in contact with the upper face of the circuit 102 and, if applicable, of the reflector 701. The layer 301 is, for example, deposited in a continuous manner along substantially the entire surface of the sensor. For instance, the layer 301 is made of polyimide or of silicon oxide. The thickness of the layer 301 sets the distance between the upper face of the circuit 102 and/or of the reflector 701 and the bolometric microboard 103 of the pixel. For instance, the layer 301 has a thickness comprised between 1 and 5 µm, for example in the order of 2.5 µm.

FIG. 7A further depicts the formation of the electrical connection posts 107a and 107b of the pixel, in vias etched in the sacrificial layer 301 in vertical alignment with the connection pads 109a and 109b of the circuit 102. The posts 107a and 107b extend vertically along substantially the entire thickness of the layer 301, from the upper face of the connection pads 109a and 109b of the circuit 102, until the upper face of the layer 301.

FIG. 7A additionally depicts a step, subsequent to the formation of the posts 107a and 107b, of depositing, on the upper face of the sacrificial layer 301, a first electrically insulating layer 703, for example made of silicon nitride (SiN), of aluminium nitride (AlN) or of silicon carbide (SiC), which acts as a support for the construction of the microboard 103 and the thermal insulation arms 105a, 105b of the pixel. The layer 303 is, for example, deposited in a continuous manner along substantially the entire surface of the sensor, then etched locally in vertical alignment with the posts 107a and 107b in order to form openings 704a, 704b across from a central part of the upper face of the posts 107a, 107b, respectively, making possible the establishment of an electrical contact on the upper face of the posts.

Figure 7B:
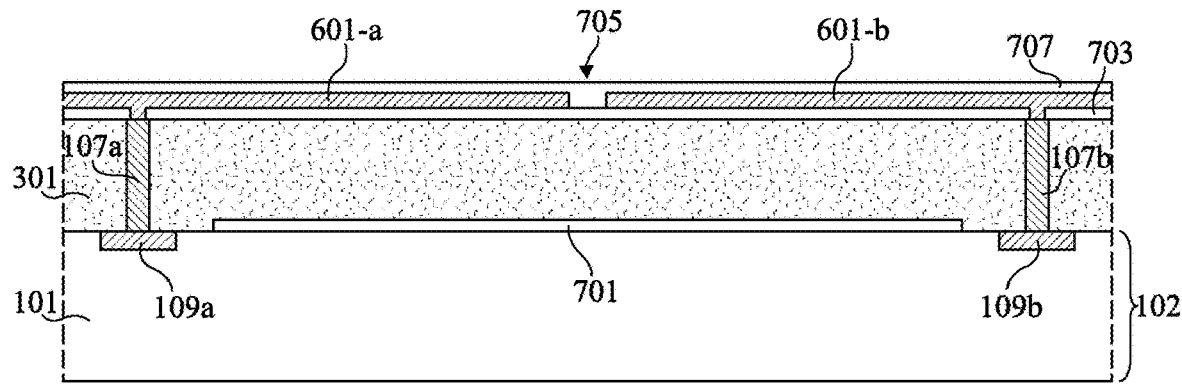

FIG. 7B depicts a subsequent step of depositing, on the upper face of the insulating layer 703 and on the upper face of the posts 107a, 107b cleared at the openings 704a, 704b, a layer 601 made of a material that is absorbent for the radiation to be detected, in order to form the absorber of the microbolometer of the pixel. The layer 601 is, for example, deposited in a continuous manner along substantially the entire surface of the sensor. In particular, in the illustrated example, the layer 601 is in contact with the upper face of the insulating layer 703, and with a part of the upper face of the electrical connection posts 107a, 107b.

FIG. 7B further depicts a step of etching a trench 705 in the layer 601, aimed at separating the absorber into two disjunct portions 601-a and 601-b in the future bolometric microboard 103 of the pixel. Indeed, in this example, the absorber 601 is made of an electrically conductive material, for example titanium nitride, and is used not only for its function of absorber, but also as an electrical conductor in order to electrically couple the ends of the thermistor of the pixel to the circuit 102, by way of the electrical connection posts 107a, 107b. It is thus appropriate to separate the absorber into two disjunct portions or electrodes, one (the portion 601-a) connected to the post 107a and to a first end of the thermistor of the pixel, and the other (the portion 601-b) connected to the post 107b and to a second end of the thermistor of the pixel. The trench 705 extends vertically from the upper face until the lower face of the layer 601, and ends at the upper face of the insulating layer 703. When viewed from above, the trench 705 extends, for example, along the entire width of the future bolometric microboard 103, in a central part of the microboard.

FIG. 7B additionally depicts a step of depositing, on the upper face of the structure obtained after the formation of the trench 705, a second electrically insulating layer 707, for example of the same nature as the layer 703, covering the upper face of the layer 601, as well as the lateral walls and the bottom of the trenches 705. The layer 707 is, for example, deposited in a continuous manner along substantially the entire surface of the sensor.

Figure 7C:
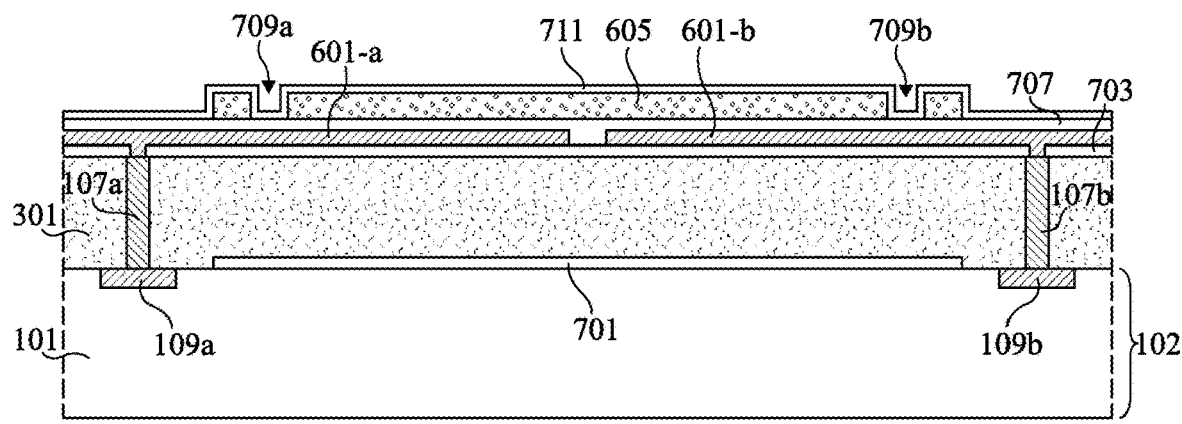

FIG. 7C depicts a step of depositing the heat-sensitive layer 605 on and in contact with the upper face of the insulating layer 707. For instance, the heat-sensitive layer 605 is deposited in a continuous manner along the entire surface of the sensor, then etched in order to be retained on the microboard 103 of each pixel only. In each pixel, two localised openings 709a and 709b are further etched into the heat-sensitive layer 605, respectively across from the portion 601-a and across from the portion 601-b of the absorber 601, with a subsequent step for the purpose of establishing an electrical contact on the portions 601-a and 601-b of the absorber, in order to connect the thermistor of the pixel to the read circuit 102. The openings 709a and 709b are, for example, respectively disposed in the vicinity of two opposite edges of the microboard. In the illustrated example, the openings 709a and 709b extend along the entire thickness of the heat-sensitive layer 605, and end at the upper face of the insulating layer 707. Depending on the type of heat-sensitive material used, an annealing of the layer 605 can potentially be implemented in order to obtain the desired crystalline phase and transition temperature of the material. For instance, in the case of a heat-sensitive layer made of vanadium dioxide ($VO_2$), the deposition can be realised at room temperature by spraying a vanadium target in an atmosphere containing oxygen, then an annealing at a temperature in the order of 350 to 400° C. can be implemented in order to crystallise the layer of vanadium oxide and obtain the desired heat-sensitive properties. The etching of the heat-sensitive layer 605 can be realised before or after the annealing. The heat-sensitive layer has, for example, a thickness comprised between 20 and 100 nm, for example between 20 and 60 nm.

FIG. 7C additionally depicts a step, subsequent to the etching and to the annealing of the heat-sensitive layer 605, of depositing a third electrically insulating layer 711, for example of the same nature as the layer 703 and/or as the layer 707, on the upper surface of the structure. The layer 711 is, for example, deposited in a continuous manner along substantially the entire surface of the sensor. In the illustrated example, the insulating layer 711 extends on and in contact with the upper face and with the sides of the heat-sensitive layer 605, and on and in contact with the upper face of the insulating layer 707. The insulating layer 711 further extends on and in contact with the lateral walls and the bottom of the openings 709a, 709b formed in the heat-sensitive layer.

Figure 7D:
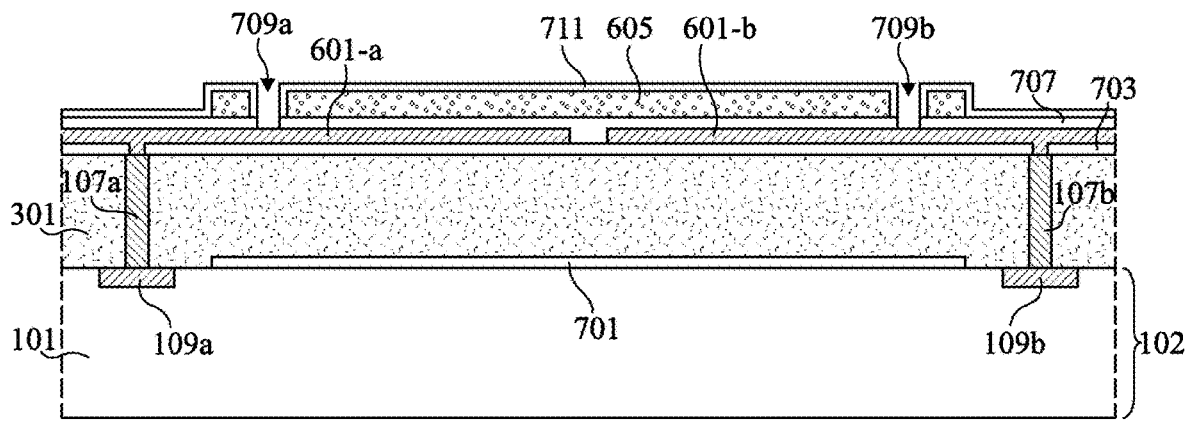

FIG. 7D depicts a subsequent step of localised etching the insulating layers 711 and 707 at the bottom of the openings 709a, 709b, so as to free up the access to the upper face of the portions 601-a, 601-b of the absorber 601.

Figure 7E:
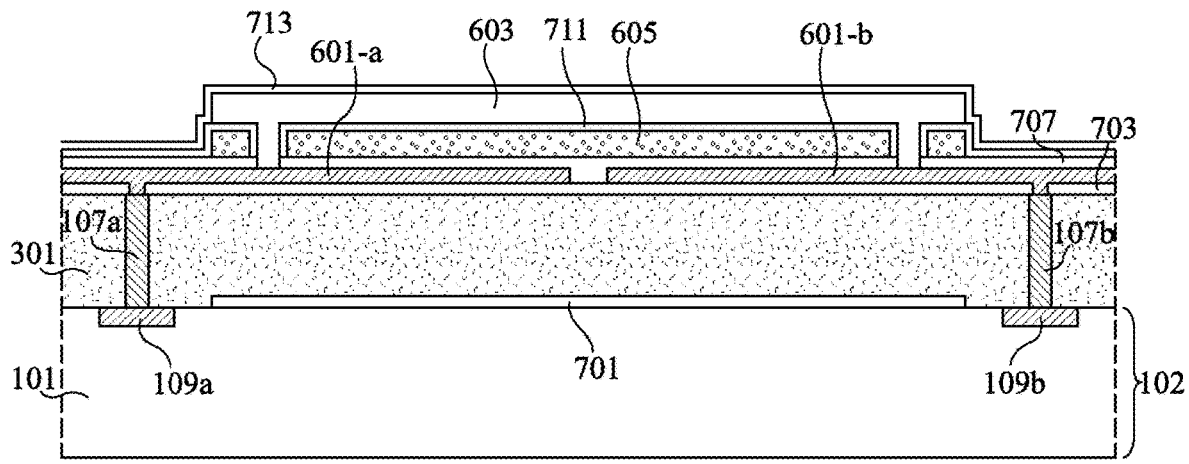

FIG. 7E depicts a step of depositing a layer 603 of the thermometer material, for example amorphous silicon or vanadium oxide, on the upper face of the structure obtained at the end of the step of FIG. 7D, in order to realise the thermistor of the pixel. The layer 603 is, for example, deposited in a continuous manner along substantially the entire surface of the sensor, then etched in order to be retained on the microboard 103 of the pixel only. The layer 603 is in particular deposited inside the openings 709a, 709b so that the thermistor 603 is connected on one side (by a first end) to the pad 109a of the circuit 102 by way of the portion 601-a of the absorber 601 and the connection post 107a, and on the other side (by a second end) to the pad 109b of the circuit 102 by way of the portion 601-b of the absorber 601 and the connection post 107b.

FIG. 7E additionally depicts a step of depositing a fourth electrically insulating layer 713, for example of the same nature as the layers 703, 707 and/or 711, on the upper surface of the structure. The layer 713 is, for example, deposited in a continuous manner along substantially the entire surface of the sensor, and in particular on and in contact with the upper face and the sides of the thermistor 603.

Figure 7F:
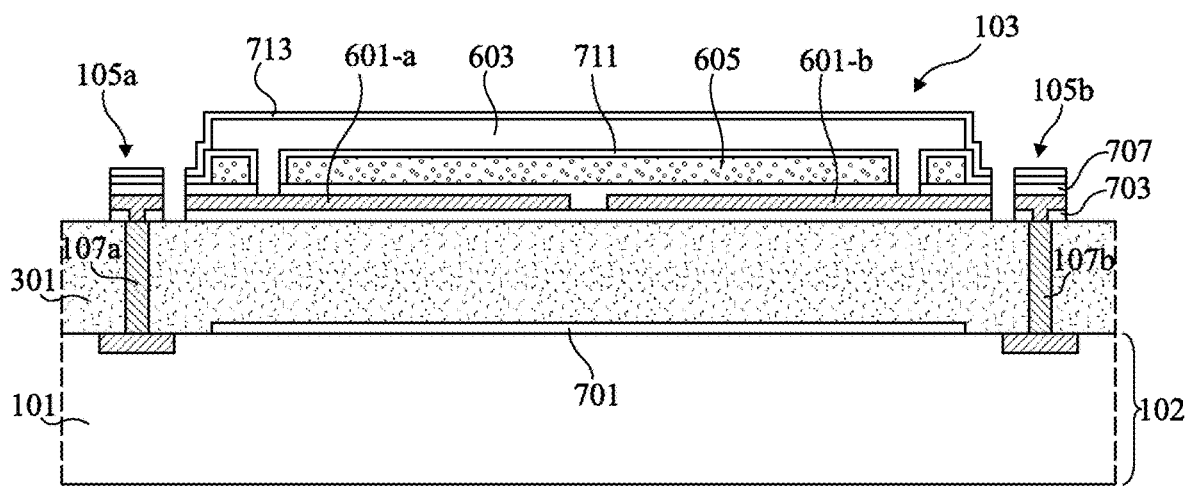

FIG. 7F depicts a subsequent step of engraving the stack formed by the layers 703, 601, 707, 711 and 713 so as to delimit or individualise the microboard 103 and the arms 105a, 105b of the pixel. During this step, the stack 703-601-707-711-713 is, for example, removed everywhere except at the microboards 103 and the arms 105a, 105b of the pixels of the sensor.

The method can then continue in a classic fashion, either directly by the removal of the sacrificial layer 301 in order to free the microboard 103 and the arms 105a, 105b of the pixel, or, if the formation of an encapsulation cap is desired, by the deposition of a second sacrificial layer then by the formation of the encapsulation cap according to the methods of the type described in relation to FIGS. 3C to 3F.

In the example described in relation to FIGS. 7A to 7F, when a recrystallisation annealing of the layer 605 is realised in order to obtain the desired heat-sensitive properties, this annealing is realised before the deposition of the thermometer layer 603. By this means, the thermometer properties of the layer 603 are not damaged by the annealing. In particular, in cases where the heat-sensitive layer 605 and the thermometer layer 603 are both made of vanadium oxide, this makes it possible to obtain, in the same structure, crystalline vanadium dioxide in the heat-sensitive layer 605, and a vanadium oxide exhibiting different crystalline properties, optimised for its thermometer properties, in the thermometer layer 603.

As a variant, in cases where the thermometer material can endure the recrystallisation annealing of the heat-sensitive material without significant damage, which is the case, for example, with amorphous silicon (in the case of a heat-sensitive layer made of vanadium dioxide), the heat-sensitive layer 605 can be formed above the thermometer layer 603.

Furthermore, it can be provided to deposit the heat-sensitive material above the thermometer material, then to recrystallise the heat-sensitive material by rapid thermal annealing of the RTA type, for example by means of a lamp or a laser irradiating the upper face of the assembly, so as to limit the increase in temperature of the thermometer layer during the annealing. In this case, a buffer layer can further be provided between the thermometer layer and the heat-sensitive layer, in order to limit the increase in temperature of the thermometer layer during annealing.

In a variant embodiment, the heat-sensitive layer 605 can be disposed on the side of the lower face of the absorber 601, i.e. on the side of the absorber opposite the face of illumination of the pixel. By means of this configuration, although less advantageous, it is also possible to limit the absorption of the incident electromagnetic radiation during the closure of the shutter, inasmuch as the shutter thus limits the absorption of the flux reflected by the layer 701.

It should, furthermore, be noted that in cases where the heat-sensitive material is a crystalline metal oxide having an insulating phase and a metal phase, the transition between the two phases can be accompanied by a significant variation in the density of the layer 605. This can induce stresses capable of destabilising the microboard. In order to limit these stresses, adapted structures of the heat-sensitive layer 605 can be provided. For example, in each pixel of the sensor, the heat-sensitive layer 605 of the pixel can be a discontinuous layer constituted by a plurality of disjunct areas separated by relatively narrow trenches, for example not occupying more than 20% of the surface area of the microboard.

Preferably, in order to facilitate the thermal coupling between the absorber 601 and the heat-sensitive layer 605, the distance between the absorber 601 and the heat-sensitive layer 605 is relatively small, for example less than 20 nm. For instance, the insulating layer 707, interfacing between the absorber 601 and the heat-sensitive layer 605 (the insulating layer 707 has its lower face in contact with the upper face of the absorber 601 and its upper face in contact with the lower face of the heat-sensitive layer 605), has a thickness comprised between 1 and 20 nm, for example in the order of 10 nm.

FIG. 7bis is a sectional view depicting a variant embodiment of the radiation sensor described in relation to FIGS. 7A to 7F, in which the absorber 601 is in contact with the heat-sensitive layer 605, so as to maximise the thermal coupling between the absorber 601 and the heat-sensitive layer 605.

The radiation sensor of FIG. 7bis, and its method of manufacture, comprise elements in common with the radiation sensor and the method of manufacture described in relation to FIGS. 7A to 7F. In the following, only the differences between the two example embodiments will be described in detail.

The manufacture of the sensor of FIG. 7bis is identical or similar to that of the sensor of FIGS. 7A to 7F, down to the deposition of the conducting absorption layer 601.

As in the example of FIGS. 7A to 7F, a trench 705 is then etched in the layer 601 in order to separate the absorber 601 into two disjunct portions 601-a and 601-b. However, unlike the example of FIGS. 7A to 7F where, when viewed from above, the portions 601-a and 601-b of the absorber are symmetrical with respect to the trench 705, in the example of FIG. 7bis, the portions 601-a and 601-b of the absorber are asymmetrical with respect to the trench 705. More specifically, in this example, when viewed from above, the surface area of the portion 601-a of the absorber is greater, for example at least three times greater, than the surface area of the portion 601-b of the absorber.

As in the example of FIGS. 7A to 7F, an electrically insulating layer 707 is deposited on the upper face of the structure obtained after the formation of the trench 705, i.e. on the upper face of the layer 601, as well as on the lateral walls and on the bottom of the trench 705. In the example of FIG. 7bis, the layer 707 is then removed locally in order to expose all or part of the upper face of the portion 601-a of the absorber and/or all or part of the upper face of the portion 601-b of the absorber. In this example, the layer 707 is retained in the trench 705 only and, potentially, on a part of the upper face of the portion 601-a and/or of the portion 601-b of the absorber, in the immediate vicinity of the trench 705.

The heat-sensitive layer 605 is then deposited in a manner identical or similar to what has been described in the foregoing, with the difference that, in the example of FIG. 7bis, the heat-sensitive layer 605 comes into contact with the upper face of the portions 601-a and 601-b of the absorber.

In addition, in the example of FIG. 7bis, in order to avoid that the heat-sensitive layer 605 short-circuits the portions 601-*a* and 601-*b* of the absorber, a through trench 706, ending at the upper face of the insulating layer 707, is formed in the heat-sensitive layer 605 in vertical alignment with the trench 705, so as to separate the heat-sensitive layer 605 into two disjunct parts 605-*a* and 605-*b*, respectively in contact with the portion 601-*a* of the absorber and with the portion 601-*b* of the absorber. The trench 706 is, for example, formed at the same time as the openings for establishing contact 709*a* and 709*b* (FIG. 7C).

The method can then be continued in a manner identical or similar to what has been described in relation to FIGS. 7A to 7F.

More generally, other manufacturing methods are conceivable by means of which it is possible to contact the heat-sensitive layer 605 with all or part of the upper face of the absorber 601. For instance, the heat-sensitive layer can be in contact with only one of the two portions 601-*a* and 601-*b* of the absorber, preferably the largest of the two portions (the portion 601-*a* in the example of FIG. 7*bis*) in order to support thermal coupling, and in order to be electrically insulated from the other portion of the absorber by the layer 707. By this means, it is possible to omit the separation trench 706 of the example of FIG. 7*bis*.

An advantage of the radiation sensors of the type described in relation to FIGS. 6, 7A to 7F, and 7*bis* is that each pixel of the sensor is individually protected against a blooming.

In addition, in the open state, the entire surface of the shutter across from the conversion element for converting the incident radiation into thermal energy is transparent for the radiation to be detected, so that the shutter does not attenuate or hardly attenuates the incident radiation.

A further advantage of the embodiment of FIGS. 6, 7A to 7F, and 7*bis* is that the obtained anti-blooming protection is a passive protection, which works even in the absence of an electrical power supply to the sensor.

Example embodiments in which each pixel comprises a suspended microboard 103 disposed in a cavity specific to the pixel, closed hermetically by a cap 111 specific to the pixel, have been described in detail above. Those skilled in the art will be capable, however, of providing variants in which a plurality of suspended microboards belonging to separate pixels are disposed in a same cavity closed by an encapsulation cap common to a plurality of pixels.

In addition, the embodiment of FIGS. 6, 7A to 7F, and 7*bis* is compatible with a sensor in which the suspended microboards 103 do not have an encapsulation cap mounted on top of them.

Moreover, example embodiments have been described, in relation to FIGS. 6, 7A to 7F and 7*bis*, in which each pixel of the sensor comprises a suspended microboard 103 comprising a microbolometer. As a variant, the microbolometer can be replaced by another type of conversion element for converting the incident electromagnetic radiation into an electrical signal, for example a heat detector or a detector based on the conversion of the incident radiation into thermal energy, for example a thermistor, a pyro-electric detector, or a detector based on field-effect transistors or based on pn diodes.

Third Embodiment—Passive Protection on Arm

Figure 8:
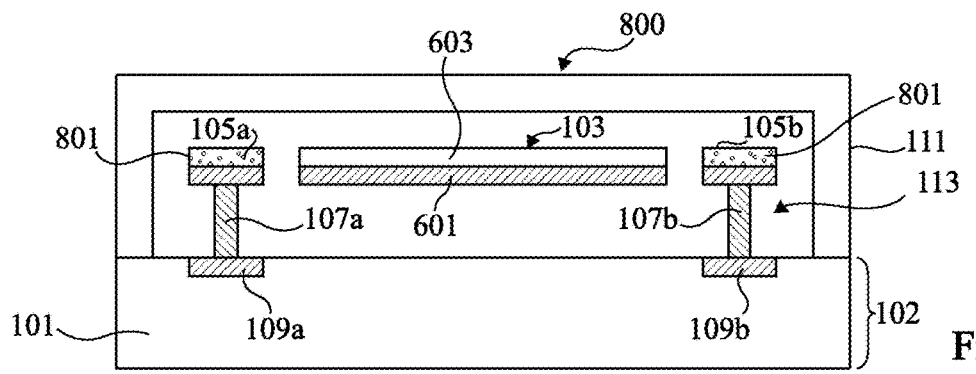
FIG. 8 is a simplified sectional view of an example of a pixel of a radiation sensor according to a third embodiment.

FIG. 8 is a simplified sectional view of an example of a pixel 800 of a radiation sensor according to a third embodiment. The pixel 800 of FIG. 8 comprises elements in common with the pixels described in the foregoing. In the following, only the differences with respect to the examples of the first and second embodiments will be described in detail.

As in the examples described in the foregoing, the pixel 800 of FIG. 8 is formed in and on a semiconductor substrate 101, for example made of silicon, and comprises an electronic monitor and read circuit 102 formed in and on the substrate 101. In addition, as in the foregoing examples, the pixel 800 comprises a microboard 103 suspended above the circuit 102 by thermal insulation arms, two arms 105*a* and 105*b* in the illustrated example, and vertical conductive posts 107*a*, 107*b* coupled to connection pads 109*a*, 109*b* of the circuit 102. The pixel 800 can further comprise, as in the foregoing examples, a cap 111 that is transparent to the radiation to be detected, lying on the upper face of the monitor circuit 102 and delimiting, together with the upper face of the monitor circuit 102, a cavity or hermetic enclosure 113 in which the suspended microboard 103 is located. The cavity 113 can be placed under a vacuum or under a pressure lower than the atmospheric pressure so as to reinforce the thermal insulation of the microboard 103.

Unlike the examples of the first embodiment, the pixel 800 of FIG. 8 does not comprise an active optical shutter and in particular does not comprise a heat-sensitive layer covering a face of the transparent cap 111 across from the microboard 103 and connected to the monitor and read circuit 102 of the pixel. More specifically, in the example of FIG. 8, the pixel 800 does not comprise the connection posts 121*a*, 121*b*, the connection pads 119*a*, 119*b*, the heating resistor 117, and the heat-sensitive layer 115 of the examples of the first embodiment.

In addition, unlike the examples of the second embodiment, the pixel 800 of FIG. 8 does not comprise a passive optical shutter constituted by a heat-sensitive layer integrated into the microboard 103.

The microboard 103 of the pixel 800 comprises a conversion element for converting the incident electromagnetic radiation into thermal energy. In the illustrated example, the microboard 103 is a bolometric microboard that differs from the microboard 103 of the pixel 600 of FIG. 6 mainly in that it does not comprise the heat-sensitive layer 605. Thus, the microboard 103 of the pixel 800 of FIG. 8 comprises an absorber 601, for example identical or similar to that of the microboard 103 of the pixel of FIG. 6, and a thermistor 603 thermally coupled to the absorber 601, for example identical or similar to that of the microboard 103 of the pixel of FIG. 6. Two ends of the thermistor are electrically connected to the monitor circuit of the pixel, by electric couplings passing via the arms 105*a*, 105*b* and the suspension posts 107*a*, 107*b* for suspending the microboard.

According to an aspect of the embodiment of FIG. 8, at least one of the thermal insulation arms of the pixel 800 comprises a layer 801 made of a phase-change material exhibiting, below a transition temperature, a relatively low thermal conductivity, and, above the transition temperature, a relatively high thermal conductivity, i.e. higher than its thermal conductivity below the transition temperature. In the illustrated example, the layer 801 is present in the two suspension arms 105*a*, 105*b* of the pixel, and is not present on the microboard 103. The variation in the thermal conductivity of the phase-change material around the transition temperature is preferably relatively steep, for example greater than 0.08 W/m·K per degree. A passive anti-blooming protection of the pixel is thus obtained, which works as follows. During normal operation, the material of the layer 801 exhibits a relatively low thermal conductivity, so that the thermal resistance between the microboard 103 and the substrate is relatively high, which facilitates the implementation of measurements of the incident electromagnetic radiation. In the event of an excessive increase in temperature of the microboard 103 linked to a blooming of the pixel, the thermal insulation arms 105a, 105b of the pixel also increase in temperature, until they reach the transition temperature of the layer 801. The thermal resistance of the one or more arms comprising the phase-change material thus drops suddenly, which causes the evacuation toward the substrate 101 of a part of the heat accumulated in the microboard 103. This makes it possible to avoid or limit a damaging of the bolometric microboard of the pixel. When the temperature of the thermal insulation arms is brought back down below the temperature of the phase-change material, the latter returns to a relatively low thermal conductivity, and the pixel can again operate normally.

The transition temperature of the layer 801 is preferably higher than the maximum temperature that the microboard 103 can reach during normal operation, and lower than the maximum temperature that the microboard 103 can endure before a damaging of the pixel. For instance, the transition temperature of the layer 801 is comprised between 60 and 180° C. The material of the layer 801 is, for example, a crystallised metal oxide having, below its transition temperature, an insulating phase with a relatively low thermal conductivity, and, above its transition temperature, a metal phase with a relatively high thermal conductivity. The material of the layer 801 is, for example, crystallised vanadium dioxide ($VO_2$), having a transition temperature in the order of 68° C. As a variant, the material of the layer 801 is vanadium dioxide recrystallised and doped by low-valence cations, for example $Al3+$, $Cr3+$ or $Ti_4+$, so as to increase its transition temperature. More generally, according to the desired transition temperature, other vanadium oxides can be used, for example $V_3O_5$. For instance, the layer 801 has a thickness comprised between 10 and 100 nm, for example in the order of 50 nm.

FIGS. 9A, 9B, 9C, 9D, 9E, 9F and 9G are sectional views depicting steps of an example of a method for manufacturing a radiation sensor of the type described in relation to FIG. 8. FIGS. 9A, 9B, 9C, 9D, 9E, 9F and 9G depict more specifically the realisation of a single pixel 800 of the sensor, it being understood that, in practice, a plurality of identical or similar pixels can be formed simultaneously in and on a same semiconductor substrate 101.

Figure 9A:
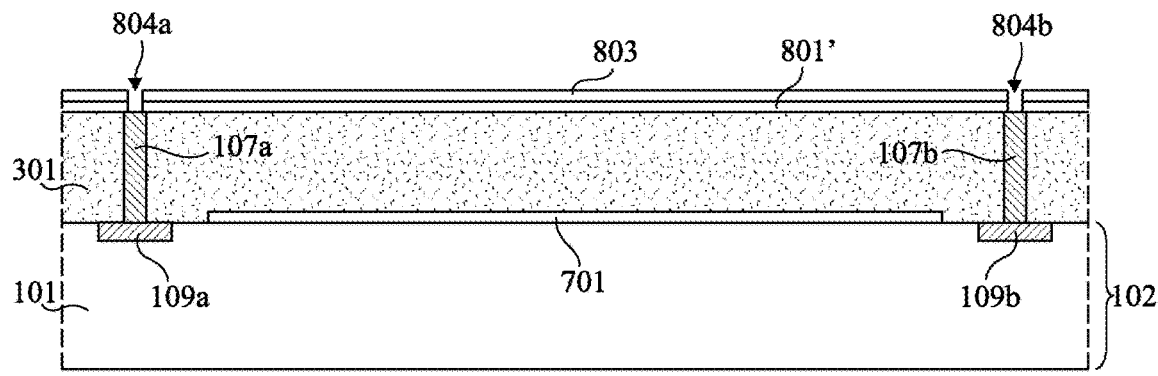
FIGS. 9A, 9B, 9C, 9D, 9E, 9F and 9G are sectional views depicting steps of an example of a method for manufacturing a pixel according to the third embodiment.

FIG. 9A depicts a step of manufacturing the monitor and read circuit 102 for monitoring and reading the pixel 800, in and on the substrate 101, for example using CMOS technology. In FIG. 9A, only the electrical connection pads 109a and 109b of the circuit 102, which are flush with the upper face of the circuit, have been illustrated.

FIG. 9A further depicts an optional step of forming, on the upper face of the circuit 102, a reflective layer 701 identical or similar to the layer 701 of the example of FIG. 7A.

FIG. 9A additionally depicts a step of depositing a sacrificial layer 301 on and in contact with the upper face of the circuit 102 and/or of the reflector 701. The layer 301 is, for example, identical or similar to the layer 301 of FIG. 7A.

FIG. 9A further depicts a step of forming the electrical connection posts 107a and 107b of the pixel, in vias etched in the layer 301 in vertical alignment with the connection pads 109a and 109b of the circuit 102. The posts 107a and 107b extend vertically along substantially the entire thickness of the layer 301, from the upper face of the connection pads 109a and 109b of the circuit 102, until the upper face of the layer 301.

FIG. 9A further depicts a step of depositing, on the upper face of the sacrificial layer 301 and on the upper face of the posts 107a, 107b, a first layer 801' made of the same material as that of the future layer 801 of the pixel. The function of the layer 801' is mainly to balance the mechanical stresses of the assembly during the realisation of the layer 801. In this example, the layer 801' is not annealed in the step of FIG. 9A, and will potentially only be annealed subsequently, at the same time as the layer 801, in cases where the layer 801 of the pixel is made of a material that requires annealing in order to obtain the desired crystalline phase and transition temperature. For instance, the layer 801' is a layer of amorphous vanadium dioxide deposited at room temperature by spraying a vanadium target in an atmosphere containing oxygen.

FIG. 9A additionally depicts a step of depositing, on the upper face of the layer 801', an electrically insulating first layer 803, for example made of silicon nitride (SiN), of aluminium nitride (AlN) or of silicon carbide (SiC).

The layers 801' and 803 are, for example, deposited in a continuous manner along substantially the entire surface of the sensor, then etched locally in vertical alignment with the posts 107a and 107b in order to form openings 804a, 804b across from a central part of the upper face of the posts 107a, 107b, respectively, making the establishment of an electrical contact on the upper face of the posts possible.

Figure 9B:
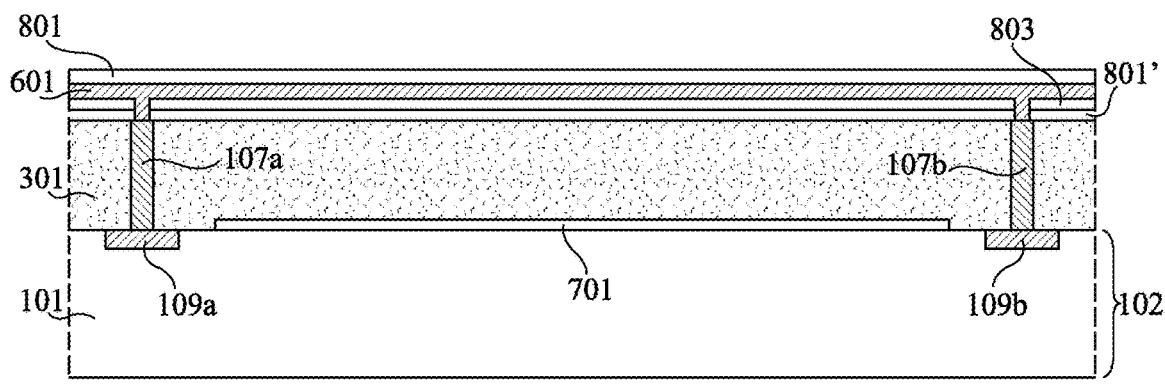

FIG. 9B depicts a step of depositing, on the upper face of the insulating layer 803, and on the bottom and on the sides of the openings 804a, 804b, a layer 601 made of a material that is absorbent for the radiation to be detected, in order to form the absorber of the microbolometer of the pixel. The layer 601 is, for example, deposited in a continuous manner along substantially the entire surface of the sensor. In particular, in the illustrated example, the layer 601 is in contact with the upper face of the insulating layer 803, and with a part of the upper face of the electrical connection posts 107a, 107b.

FIG. 9B further depicts a step of depositing, on and in contact with the upper face of the layer 601, the layer 801 made of a phase-change material. The layer 801 is, for example, deposited in a continuous manner along substantially the entire surface of the sensor. The layer 801 deposited in the step of FIG. 9B is, for example, a layer of the same nature as the layer 801' deposited in the step of FIG. 9A. For instance, the layer 801 deposited in the step of FIG. 9B is a layer of amorphous vanadium dioxide formed by spraying a vanadium target at room temperature in an atmosphere containing oxygen. The layers 801' and 801 have, for example, substantially the same thickness. For instance, each of the layers 801' and 801 has a thickness comprised between 10 and 100 nm, for example in the order of 50 nm.

Figure 9C:
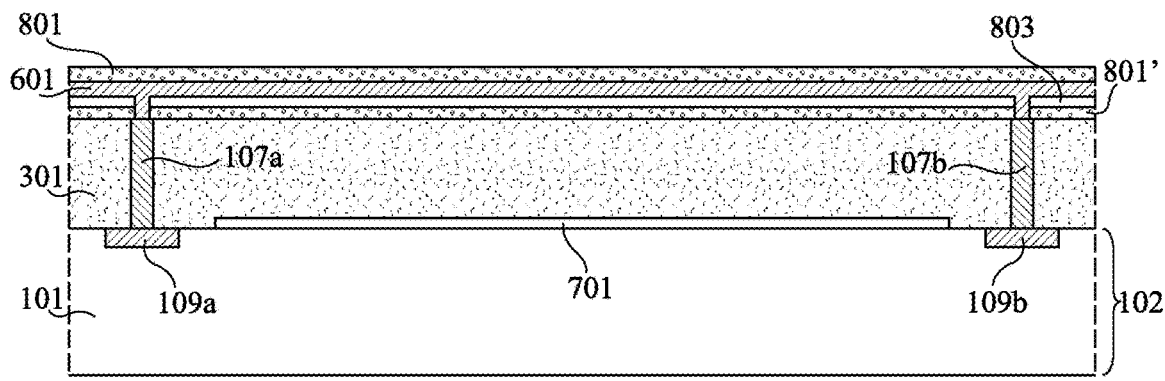

FIG. 9C depicts a step of annealing the structure obtained at the end of the steps of FIG. 9B, aimed at conferring the desired properties of variable thermal conductivity to the layer 801. During this step, the layer 801' also acquires the same properties of variable thermal conductivity as the layer 801. For instance, in the case of layers 801' and 801 made of vanadium dioxide, an annealing at a temperature in the order of 350 to 400° C. can be implemented in order to obtain the desired properties.

Figure 9D:
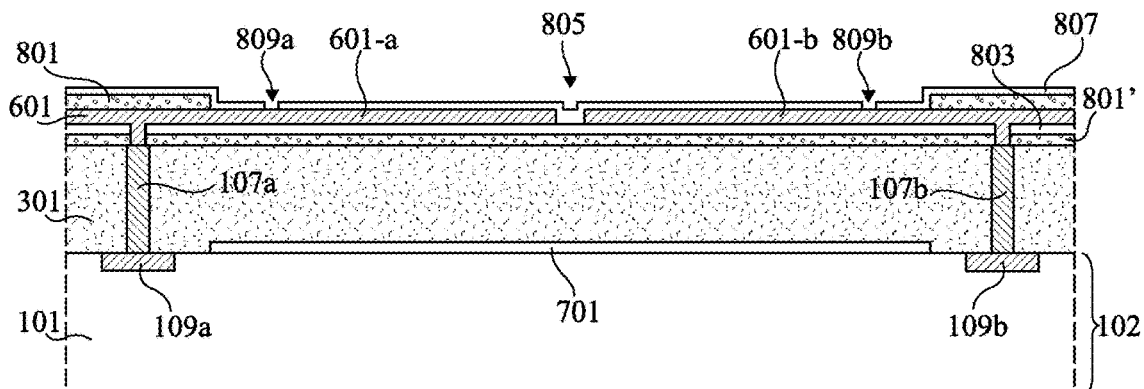

FIG. 9D depicts a step of removing the layer 801 along the entire surface of the future microboard 103, for example by etching.

FIG. 9D further depicts a step of etching a trench 805 in the layer 601, aimed at separating the absorber into two disjunct portions 601-a and 601-b in the future bolometric microboard 103 of the pixel. Indeed, in this example, the absorber 601 is made of an electrically conductive material, for example titanium nitride, and is used not only for its function of absorber, but also in order to electrically couple the ends of the thermistor of the pixel to the circuit 102, by way of the electrical connection posts 107*a*, 107*b*. It is thus appropriate to separate the absorber into two disjunct portions, one (the portion 601-*a*) connected to the post 107*a* and to a first end of the thermistor of the pixel, and the other (the portion 601-*b*) connected to the post 107*b* and to a second end of the thermistor of the pixel. The trench 805 extends vertically from the upper face until the lower face of the layer 601, and ends at the upper face of the insulating layer 803. When viewed from above, the trench 805 extends, for example, along the entire width of the future bolometric microboard 103, in a central part of the microboard.

FIG. 9D additionally depicts a step of depositing, on the upper face of the structure obtained after the formation of the trench 805, a second electrically insulating layer 807, for example of the same nature as the layer 803, covering the upper face of the layer 601, as well as the lateral walls and the bottom of the trenches 805. The layer 807 is, for example, deposited in a continuous manner along substantially the entire surface of the sensor. In each pixel, two localised openings 809*a* and 809*b* are realised the insulating layer 807, for example by etching, respectively across from the portion 601-*a* and across from the portion 601-*b* of the absorber 601, with a subsequent step for the purpose of establishing an electrical contact on the portions 601-*a* and 601-*b* of the absorber, in order to connect the thermistor of the pixel to the read circuit 102. The openings 809*a* and 809*b* are, for example, respectively disposed in the vicinity of two opposite edges of the microboard. In the illustrated example, the openings 809*a* and 809*b* extend vertically along the entire thickness of the insulating layer 807, and end at the upper face of the layer 601.

Figure 9E:
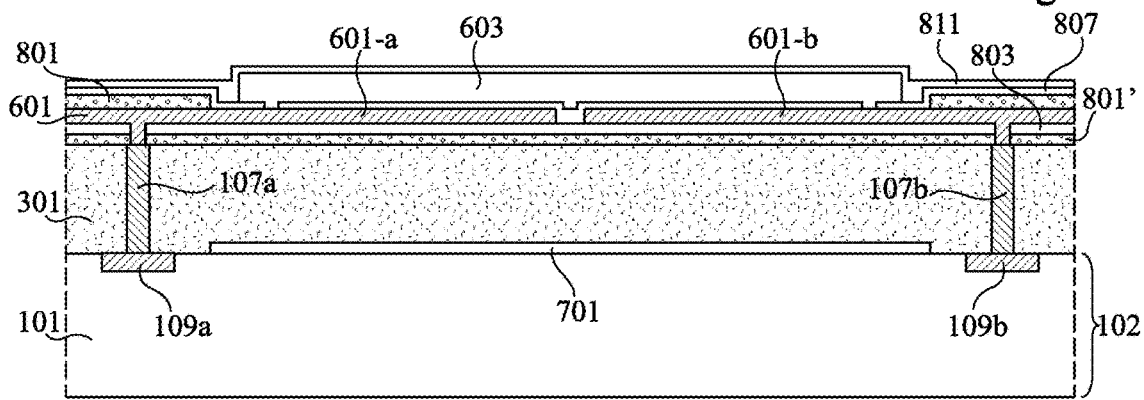

FIG. 9E depicts a step of depositing a layer 603 of the thermometer material, for example amorphous silicon or vanadium oxide, on the upper face of the structure obtained at the end of the step of FIG. 9D, in order to realise the thermistor of the pixel. The layer 603 is, for example, deposited in a continuous manner along substantially the entire surface of the sensor, then etched in order to be retained on the microboard 103 of the pixel only. The layer 603 is in particular deposited inside the openings 809*a*, 809*b* so that the thermistor 603 is connected on one side (by a first end) to the pad 109*a* of the circuit 102 by way of the portion 601-*a* of the absorber 601 and of the connection post 107*a*, and on the other side (by a second end) to the pad 109*b* of the circuit 102 by way of the portion 601-*b* of the absorber 601 and the connection post 107*b*.

FIG. 9E additionally depicts a step of depositing a third electrically insulating layer 811, for example of the same nature as the layers 803 and 807, on the upper surface of the structure. The layer 811 is, for example, deposited in a continuous manner along substantially the entire surface of the sensor, and in particular on and in contact with the upper face and the sides of the thermistor 603.

Figure 9F:
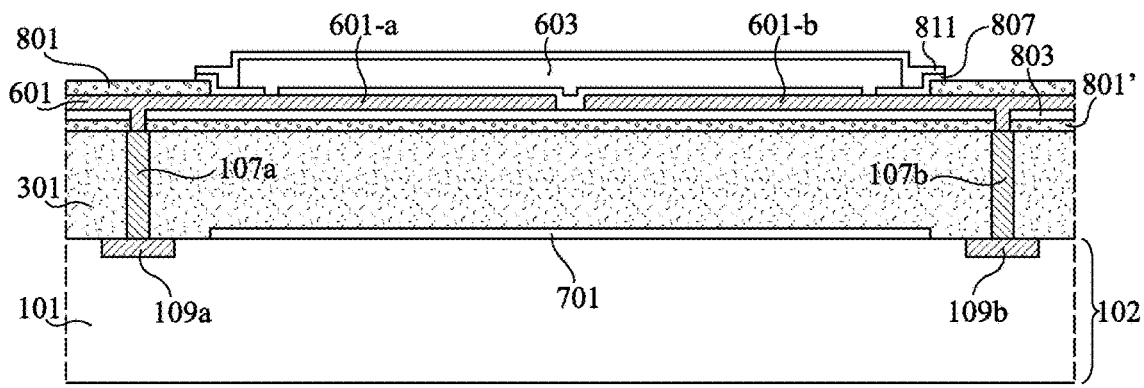

FIG. 9F depicts a subsequent step of removing the insulating layers 807 and 811 outside of the future microboard 103 of the pixel, and in particular across from the future thermal insulation arms 105*a*, 105*b* of the pixel. For instance, the layers 807 and 811 are removed everywhere except across from the microboards 103 of the pixels of the sensor.

Figure 9G:
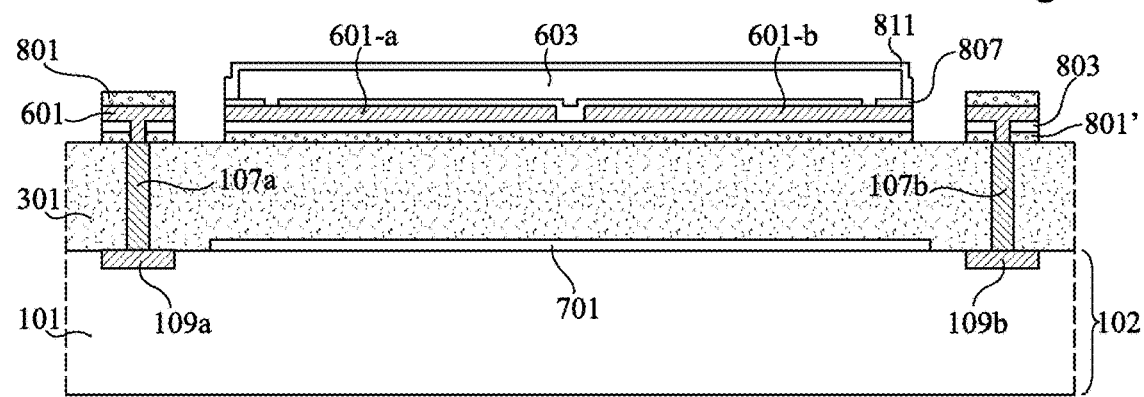

FIG. 9G depicts a subsequent step of etching the stack formed by the layers 801, 601, 803 and 801 so as to delimit or individualise the microboard 103 and the arms 105*a*, 105*b* of the pixel. During this step, the stack 801-601-803-801 is, for example, removed everywhere except at the microboards 103 and the arms 105*a*, 105*b* of the pixels of the sensor.

The method can then continue in a classic fashion, either directly by the removal of the sacrificial layer 301 in order to free the microboard 103 and the arms 105*a*, 105*b* of the pixel, or, if the formation of an encapsulation cap is desired, by the deposition of a second sacrificial layer then by the formation of the encapsulation cap according to the methods of the type described in relation to FIGS. 3C to 3F.

An advantage of the radiation sensors of the type described in relation to FIGS. 8 and 9A to 9G is that each pixel of the sensor is individually protected against a blooming.

A further advantage is that, in the absence of blooming, the protective device does not attenuate the radiation to be detected.

A further advantage of the embodiment of FIGS. 8 and 9A to 9G is that the obtained anti-blooming protection is a passive protection, which works even in the absence of an electrical power supply to the sensor.

As a variant, the layer 801' of the method described in relation to FIGS. 9A to 9G can be omitted, which makes it possible not to add an additional layer to the microboard 103 of the pixel, and thus not to increase the thermal capacitance of the microboard. A further advantage is that this also limits the number of layers present in the thermal insulation arms, and thus limits their thermal conductivity, which makes it possible to improve the thermal sensitivity of the pixel.

Various embodiments with various variants have been described above. It should be noted that those skilled in the art will be able to combine different elements of these various embodiments without implementing an inventive step. In particular, the anti-blooming protections of the first, second and third embodiments can be combined into all or part of a same pixel of a radiation sensor. In particular, it is possible to provide a combination of the active protection of the first embodiment with one and/or the other of the passive protections of the second and third embodiments, or a combination of the passive protections of the second and third embodiments without the active protection of the first embodiment.

The invention claimed is:

1. A radiation sensor comprising a plurality of pixels formed in and on a semiconductor substrate, each pixel comprising a microboard suspended above the substrate by thermal insulation arms, the microboard comprising, in order starting from the upper face of the substrate:
   a conducting layer adapted to convert incident electromagnetic radiation into thermal energy;
   a passive optical shutter comprising a heat-sensitive layer covering one of the faces of the conducting layer, the heat-sensitive layer being thermally coupled to the conducting layer and having a reflection coefficient for the radiation to be detected that increases as a function of its temperature; and
   a thermistor covering the face of the heat-sensitive layer opposite the conducting layer.

2. The sensor according to claim 1, wherein the distance between the conducting layer and the heat-sensitive layer is less than 20 nm.

3. The sensor according to claim 1, wherein the conducting layer is in contact with the heat-sensitive layer.

4. The sensor according to claim 1, wherein the thickness of the heat-sensitive layer is comprised between 20 and 60 nm.

5. The sensor according to claim 1, wherein the conducting layer is separated into first and second disjunct portions by an isolation trench.

6. The sensor according to claim 5, wherein the surface area of the first portion is greater than the surface area of the second portion.

7. The sensor according to claim 6, wherein the heat-sensitive layer has a transition temperature comprised between 60 and 180° C.

8. The sensor according to claim 1, wherein the heat-sensitive layer is made of a phase-change material.

9. The sensor according to claim 8, wherein the heat-sensitive layer is made of a metal oxide having an insulating phase that is transparent for the radiation to be detected and a metal phase that is reflective for the radiation to be detected.

10. The sensor according to claim 9, wherein the heat-sensitive layer is made of a vanadium oxide or a titanium oxide.

11. The sensor according to claim 8, wherein the heat-sensitive layer is made of $Ag_2S$ or of FeS.

12. The sensor according to claim 1, wherein each pixel further comprises a read circuit for reading the value of the thermistor of the pixel.

13. The sensor according to claim 1, wherein, in each pixel, the conducting layer is made of a material that is absorbent for the radiation to be detected.

14. The sensor according to claim 1, wherein, in each pixel, the conducting layer is a metal layer.

15. The sensor according to claim 1, wherein, in each pixel, the conducting layer is made of titanium nitride.

16. The sensor according to claim 1, wherein, in each pixel, the thermal insulation arms lie on vertical electrical connection posts.

17. The sensor according to claim 1, wherein, in each pixel, the microboard and the thermal insulation arms are disposed in a cavity closed by a cap that is transparent for the radiation to be detected.

18. The sensor according to claim 17, wherein, in each pixel, the transparent cap hermetically closes the cavity, and the cavity is at a pressure that is lower than the atmospheric pressure.

* * * * *